US005554859A

United States Patent [19]

Tsukamoto et al.

[11] Patent Number: 5,554,859

[45] Date of Patent: Sep. 10, 1996

[54] ELECTRON EMISSION ELEMENT WITH SCHOTTKY JUNCTION

[75] Inventors: Takeo Tsukamoto; Nobuo Watanabe, both of Atsugi; Toshihiko Takeda; Masahiko Okunuki, both of Tokyo, all of Japan

[73] Assignee: Canon Kabushiki Kaisha, Tokyo, Japan

[21] Appl. No.: 557,678

[22] Filed: Nov. 13, 1995

Related U.S. Application Data

[63] Continuation of Ser. No. 320,552, Oct. 11, 1994, abandoned, which is a continuation of Ser. No. 140,965, Oct. 25, 1993, abandoned, which is a continuation of Ser. No. 745,975, Aug. 12, 1991, abandoned, which is a continuation of Ser. No. 575,868, Aug. 31, 1990, abandoned.

[30] Foreign Application Priority Data

| | | | |
|---|---|---|---|
| Sep. 4, 1989 | [JP] | Japan | 1-229084 |
| Sep. 7, 1989 | [JP] | Japan | 1-233931 |
| Sep. 7, 1989 | [JP] | Japan | 1-233932 |
| Oct. 13, 1989 | [JP] | Japan | 1-267576 |
| Oct. 13, 1989 | [JP] | Japan | 1-267577 |
| Oct. 13, 1989 | [JP] | Japan | 1-267578 |
| Oct. 13, 1989 | [JP] | Japan | 1-267579 |

[51] Int. Cl.$^6$ .............................. H01L 29/06; H01L 29/12

[52] U.S. Cl. .............................. 257/10; 257/11; 257/473; 257/484; 257/623; 313/3; 315/244; 315/310; 315/309; 315/311

[58] Field of Search .............................. 357/15, 68, 65, 357/71, 67 S, 71 S, 55, 52, 52 C; 313/309, 310, 311, 336, 351, 243, 291, 306; 315/3, 1, 14, 15, 16; 250/423 F

[56] References Cited

U.S. PATENT DOCUMENTS

| | | | |
|---|---|---|---|
| 4,259,678 | 3/1981 | Van Gorkom et al. | 357/55 X |
| 4,303,848 | 12/1981 | Shimizu et al. | 313/311 X |
| 4,303,930 | 12/1981 | Van Gorkom et al. | 357/55 X |
| 4,319,158 | 3/1982 | Watanabe et al. | 313/311 X |
| 4,766,340 | 8/1988 | van der Mast et al. | 313/366 |
| 4,801,994 | 1/1989 | Van Gorkom et al. | 257/10 X |
| 4,810,934 | 3/1989 | Shimoda et al. | 315/107 |
| 4,825,082 | 4/1989 | Okunuki et al. | 250/423 F |
| 4,833,507 | 5/1989 | Shimizu et al. | 357/4 |
| 4,904,895 | 2/1990 | Tsukamoto et al. | 313/336 |

(List continued on next page.)

FOREIGN PATENT DOCUMENTS

| | | | |
|---|---|---|---|
| 0278405 | 8/1988 | European Pat. Off. | H01J 3/02 |
| 0331373 | 9/1989 | European Pat. Off. | H01J 1/30 |
| 60-57173 | 12/1985 | Japan . | |
| 1124926 | 5/1989 | Japan | 313/311 X |
| 2112566 | 7/1983 | United Kingdom | 357/15 X |

OTHER PUBLICATIONS

Philips Research Report + Supplements, vol. 25, 1970, pp. 118–132, J. A. Appels et al., "Local Oxydation of Silicon and its application in semiconductor–device technology".

(List continued on next page.)

*Primary Examiner*—William Mintel
*Attorney, Agent, or Firm*—Fitzpatrick, Cella, Harper & Scinto

[57] ABSTRACT

This is an electron emission with a semiconductor substrate having a p-type semiconductor layer whose impurity concentration falls within a concentration range for causing an avalanche breakdown in a least a portion of a surface of the semiconductor layer. A Schottky electrode is connected to the semiconductor layer. There are a means for applying a reverse bias voltage between the Schottky electrode and the p-type semiconductor layer to cause the Schotty electrode to emit electrons, and a lead electrode, formed at a proper position, for externally guiding the emitted electrons. At least a portion of the Schottky electrode is formed of a thin film of a material selected from metals of Group 1A, Group 2A, Group 3A, and lanthanoids, metal silicides of Group 1A, Group 2A, Group Group 3A, and lanthanoids, and metal borides of Group 1A, Group 2A, Group 3A, and lanthanoids, and metal carbides of Group 4A. A film thickness of the Schotty electrode is set to be not more than 100 Å.

32 Claims, 21 Drawing Sheets

U.S. PATENT DOCUMENTS

| | | | |
|---|---|---|---|
| 4,906,894 | 3/1990 | Miyawaki et al. | 257/10 X |
| 4,956,578 | 9/1990 | Shimizu et al. | 315/3 |
| 5,031,015 | 7/1991 | Miyawaki | 257/25 X |
| 5,138,220 | 8/1992 | Kirkpatrick | 313/309 |
| 5,285,079 | 2/1994 | Tsukamoto et al. | 257/10 |

OTHER PUBLICATIONS

Stolte et al., "The Schottky Barrier Cold Cathode," *Solid–State Electronics,* Pergamon Press, 1969, vol. 12, Great Britain, pp. 945–954.

Morgan et al., "Schottky Barrier Height: A Device Parameter For Device Applications," *Solid–State Electronics,* vol. 22, 1979, pp. 865–873.

Geppert et al., "Correlation of Metal–Semiconductor Barrier Height and Work Function; Effects of Surface States," *Journal of Applied Physics,* vol. 37, No. 4, May 1966, pp. 2458–2465.

Rusu et al., "The Metal–Overlap Laterally–Diffused (MOLD) Schottky Diode," *Solid–State Electronics,* vol. 20, Jun. 1977, pp. 499–506.

Appels et al., "Local Oxidation of Silicon and Its Application in Semiconductor Device Technology," *Philips Research Reports,* vol. 25, No. 2, Apr. 1970, pp. 118–132.

Anantha et al., "Planar Mesa Schottky Barrier Diode," *IBM Journal of Research and Development,* vol. 15, Nov. 1971, pp. 462–465.

Lepselter et al., "Silicon Schottky Barrier Diode with Near–Ideal I–V Characteristics." Bell System Technical Journal, Feb. 1968, pp. 195–208.

S. M. Sze, "Physics of Semiconductor Devices," John Wiley & Sons, 2nd Edition, p. 274, N.Y., N.Y.

ELECTRON EMISSION ELEMENT WITH SCHOTTKY JUNCTION

This application is a continuation of application Ser. No. 08/320,552 filed Oct. 11, 1994, now abandoned, which is a continuation of application Ser. No. 08/140,965 filed Oct. 25, 1993, now abandoned, which is a continuation of application Ser. No. 07/745,975 filed Aug. 12, 1991, now abandoned, which is a continuation of application Ser. No. 07/575,868 filed Aug. 31, 1990, now abandoned.

BACKGROUND OF THE INVENTION (1) Field of the Invention

The present invention relates to an electron emission element and a method of manufacturing the same and, more particularly, to an electron emission element for causing an avalanche breakdown to externally emit hot electrons, and a method of manufacturing the same.

(2) Related Background Art

As a conventional electron emission element, many kinds of cold cathode electron emission elements have been studied. An electron emission element using a semiconductor material will be exemplified below as a conventional electron emission element.

Electron emission elements undergo various improvements along with the progress of semiconductor techniques.

As electron emission elements using a semiconductor material, for example, an element for applying a forward bias to a p-n junction by utilizing a negative electrode affinity to emit electrons (Japanese Patent Publication No. 60-57173), an element for applying a reverse bias to a p-n junction to cause an avalanche breakdown and emitting electrons produced by the avalanche breakdown (U.S. Pat. Nos. 4,259,678 and 4,303,930), and the like are known.

Of the conventional electron emission elements, an element employing an avalanche breakdown is arranged as follows, as described in U.S. Pat. Nos. 4,259,678 and 4,303,930. That is, p- and n-type semiconductor layers are joined to constitute a diode structure. A reverse bias voltage is applied across the diode to cause an avalanche breakdown, thereby producing hot electrons. The electrons are emitted from the surface of the n-type semiconductor layer on which cesium or the like is deposited to reduce the work function of the surface.

The surface layer of each conventional electron emission element comprises a single electrode layer.

A technique for reducing the work function of an electron emission surface to improve electron emission efficiency is known in association with these conventional electron emission elements. For example, in an electron emission element in which a reverse bias is applied to a p-n junction to cause an avalanche breakdown, cesium or the like is deposited on the surface of an n-type semiconductor layer to reduce the work function, thereby improving electron emission efficiency.

A Schottky electron emission element structure known to applicants is e.g., FIG. 1. In FIG. 1, a $p^-$-type GaAs layer 102 as a semiconductor layer is formed on a $p^+$-type GaAs substrate 101 as a semiconductor substrate by, e.g., molecular beam epitaxy (MBE). A $p^+$-type region as a high-impurity concentration region 103 for causing an avalanche breakdown is formed in the semiconductor layer 102 by implanting Be ions. An element isolation insulating layer 104 and a wiring electrode 105 are formed on the semiconductor layer 102, and a Schottky electrode 108 of, e.g., tungsten is also formed on the layer 102 by, e.g., sputtering. A lead electrode 107 is formed on the wiring electrode 105 via an insulating layer 106 of, e.g., $SiO_2$. An ohmic electrode (110) formed on the substrate (101) and an extraction electrode (111) is formed on the lead electrode (107).

The Schottky electron emission element shown in FIG. 1 is manufactured as follows. That is, the high-impurity concentration region 103 is formed in the semiconductor layer 102 by, e.g., ion implantation, and the resultant structure is subjected to proper annealing. Thereafter, a conductive layer is formed on the resultant structure and is patterned, thereby forming wiring electrodes 105. Thereafter, the insulating layer 106 is formed, and a hole is formed. Finally, a conductive layer is formed and patterned to form the Schottky electrode 108.

However, when the conventional electron emission element employs a p-n junction type diode structure, switching characteristics of the element are much lower than that of a Schottky diode, and the upper limit of a direct modulation frequency of the electron emission element is low. Therefore, applications using the electron emission element tend to be limited to a narrow range.

The conventional electron emission element has a guard ring structure around an electron emission section. However, in order to form the guard ring structure, a large element area is required, and it is difficult to achieve higher integration and micropatterning of the element.

Furthermore, the conventional electron emission element suffers from complex processes for forming an n-type guard ring layer, a p-type high-concentration layer, and an n-type surface layer on a p-type semiconductor layer, and also suffers from a technical difficulty for forming a very thin doped layer, resulting in a poor manufacturing yield. Therefore, manufacturing cost tends to be increased.

When cesium or a cesium oxide is formed on the surface of the electron emission section to reduce the work function of the electron emission section, since the cesium material is chemically very active, the following problems are always posed:

(1) a stable operation cannot be expected unless it is used in ultrahigh vacuum ($10^{-7}$ Torr or higher);

(2) a service life is changed according to a degree of vacuum; and (3) efficiency is changed according to a degree of vacuum.

Therefore, a demand has arisen for an electron emission element which can use a material other than cesium or a cesium oxide.

In the prior art, hot electrons produced at a p-n interface lose their energies by scattering when they pass through an n-type semiconductor layer. In order to prevent this, the n-type semiconductor layer must be formed to be very thin (200 Å or less). In order to uniformly form a very thin n-type semiconductor layer at a high concentration to be free from defects, there are many problems on semiconductor manufacturing processes which are incurred. Therefore, it is difficult to stably manufacture such an element in practice.

In an electron emission element in which a Schottky electrode is formed on the surface of a semiconductor layer, when the Schottky electrode is formed of a material having a low work function, the Schottky electrode is oxidized in the manufacturing process of the electron emission element to be denaturated into a high-resistance film or hydroxide. For this reason, the work function of the electron emission surface of the Schottky electrode is increased, resulting in poor electron emission efficiency and diode characteristics.

In the electron emission element described above with reference to FIG. 1, since the Schottky electrodes 108 and the lead electrodes 107 are formed after the high-impurity concentration region 103 is formed in the semiconductor layer 102, a position shift between the high-impurity concentration region 103 and the Schottky electrodes 108 or the lead electrodes 107 easily occurs. For this reason, an alignment margin must be increased to guarantee reliability or yield of the electron emission element. In terms of cost, an occupation area per element must often be increased.

In the method of manufacturing the electron emission element shown in FIG. 1, a photolithographic process must be repeated by a plurality of times corresponding to the number of times of ion implantation and the number of films to be deposited on the semiconductor layer 102. Therefore, the manufacturing process is complicated, resulting in high manufacturing cost.

SUMMARY OF THE INVENTION

The present invention has been made in consideration of the above situation, and has as its object to provide an inexpensive electron emission element which has high reliability, and can be made compact at a high density, and a method of manufacturing the same.

It is another object of the present invention to provide an electron emission element which has good switching characteristics, can be easily micropatterned, and can be manufactured at low cost, and a method of manufacturing the same.

It is still another object of the present invention to provide an electron emission element whose voltage application electrode is not easily converted into an oxide or hydroxide, and can guarantee high electron emission efficiency.

It is still another object of the present invention to provide an electron emission element comprising:

a semiconductor substrate having a p-type semiconductor layer whose impurity concentration falls within a concentration range for causing an avalanche breakdown in at least a portion of a surface thereof, a Schottky electrode for forming a Schottky junction with the p-type semiconductor layer, means for applying a reverse bias voltage to the Schottky electrode and the p-type semiconductor layer to cause the Schottky electrode to emit electrons, and a lead electrode, formed at a proper position, for externally guiding the emitted electrons, wherein at least a portion of the Schottky electrode is formed of a thin film of a material selected from the group consisting of metals of Group 1A, Group 2A, Group 3A, and lanthanoids, metal silicides of Group 1A, Group 2A, Group 3A, and lanthanoids, metal borides of Group 1A, Group 2A, Group 3A, and lanthanoids, and metal carbides of Group 4A, and a film thickness thereof is set to be not more than 100 Å.

It is still another object of the present invention to provide an electron emission element comprising a solid-state layer, a voltage application electrode for applying a bias to a surface of the solid-state layer, and an electron emission electrode for emitting electrons produced upon application of the bias, wherein a material for forming the electron emission electrode is a material having a lower work function than a material for forming the electrode application electrode.

It is still another object of the present invention to provide an electron emission element comprising: a p-type semiconductor layer; a Schottky electrode for forming a Schottky junction with the p-type semiconductor layer; means for applying a reverse bias voltage to the Schottky electrode and the p-type semiconductor layer to cause the Schottky electrode to emit electrons; and a lead electrode for externally guiding the emitted electrons, wherein an oxide film is formed around the Schottky junction portion by an LOCOS method.

It is still another object of the present invention to provide a method of manufacturing an electron emission element comprising: at least a semiconductor substrate; a semiconductor layer formed on the semiconductor substrate and having a high-impurity concentration region for causing an avalanche breakdown, a Schottky electrode formed on the semiconductor layer; a wiring electrode for supplying a charge to the Schottky electrode; a lead electrode for externally guiding emitted electrons; and an insulating layer for electrically isolating the wiring electrode and the lead electrode, including at least the steps of:

sequentially depositing conductive layers serving as the semiconductor layer and the wiring electrode, the insulating layer, and a conductive layer serving as the lead electrode on the semiconductor substrate; forming a hole in the conductive layer serving as the lead electrode, the insulating layer, and the conductive layer serving as the wiring electrode; and performing ion implantation in the semiconductor layer through the hole to form a high-impurity concentration region.

It is still another object of the present invention to provide an electron emission element comprising: a semiconductor substrate of a first conductivity type; a semiconductor layer of the first conductivity type formed on the semiconductor substrate of the first conductivity type and having an impurity concentration for causing an avalanche breakdown; a Schottky electrode for forming a Schottky junction with the semiconductor layer of the first conductivity type; means for applying a reverse bias voltage to the Schottky electrode and the semiconductor layer of the first conductivity type to cause the Schottky electrode to emit electrons; and a lead electrode for externally guiding the emitted electrons, wherein the semiconductor layer of the first conductivity type has a high-concentration doping region of the first conductivity type, the high-concentration doping layer forming a Schottky junction with the Schottky electrode.

It is still another object of the present invention to provide an electron emission element having a semiconductor substrate having a p-type semiconductor layer whose impurity concentration falls within a concentration range for causing an avalanche breakdown in at least a portion of a surface thereof, a Schottky electrode for forming a Schottky junction with the p-type semiconductor layer, means for applying a reverse bias voltage to the Schottky electrode and the p-type semiconductor layer to cause the Schottky electrode to emit electrons, and a lead electrode, formed at a proper position, for externally guiding the emitted electrons, the element comprising a low-breakdown voltage portion formed in a portion of the Schottky junction portion of the semiconductor layer and having a concentration for locally lowering a breakdown voltage than other portions, and an n-type region formed around the low-breakdown voltage portion, wherein the Schottky electrode has a small thickness which is sufficient to pass electrons produced in a depletion layer of the Schottky junction in the avalanche breakdown state.

It is still another object of the present invention to provide a method of manufacturing an electron emission element comprising the steps of: covering, with an insulating layer, a surface of a high-concentration p-type semiconductor substrate on which a low-concentration p-type semiconductor layer is grown; forming a hole in a portion serving as an n-type region by etching and doping donor ions; doping acceptor ions via the insulating layer to form a high-concentration p-type region; annealing the resultant structure while leaving the insulating layer to form a contact electrode on the insulating layer; forming an lead electrode formation insulating layer; forming a lead electrode on the insulating layer; forming an opening in the lead electrode; patterning the lead electrode formation insulating layer by etching to expose the surface of the semiconductor layer; and forming a Schottky electrode using the formed opening as a mask.

It is still another object of the present invention to provide an electron emission element having a semiconductor substrate having a p-type semiconductor layer whose impurity concentration falls within a concentration range for causing an avalanche breakdown in at least a portion of a surface thereof, a Schottky electrode for forming a Schottky junction with the p-type semiconductor layer, means for applying a reverse bias voltage to the Schottky electrode and the p-type semiconductor layer to cause the Schottky electrode to emit electrons, and a lead electrode, formed at a proper position, for externally guiding the emitted electrons, the element comprising a low-breakdown voltage portion formed in a portion of the Schottky junction portion and having a concentration for locally lowering a breakdown voltage than other portions, and a semi-insulating region formed around the low-breakdown voltage portion, wherein the Schottky electrode has a small thickness which is sufficient to pass electrons produced in a depletion layer of the Schottky junction in the avalanche breakdown state.

It is still another object of the present invention to provide a method of manufacturing an electron emission element, comprising the steps of: covering, with an insulating layer, a surface of a high-concentration p-type semiconductor substrate on which a low-concentration p-type semiconductor layer is grown; forming an opening in a portion serving as a semi-insulating region and doping ions for semi-insulating the semiconductor substrate; doping acceptor ions through the insulating layer formed first to form a high-concentration p-type region; annealing the resultant structure while leaving the insulating layer formed first to form a contact electrode on the insulating layer formed first; forming a lead electrode formation insulating layer; forming a lead electrode layer on the insulating layer; forming an opening in the lead electrode layer; patterning the lead electrode formation insulating layer by etching to expose the surface of the semiconductor layer; and forming a Schottky electrode using the formed opening as a mask.

DESCRIPTION OF THE PREFERRED EMBODIMENTS

Figure 1:
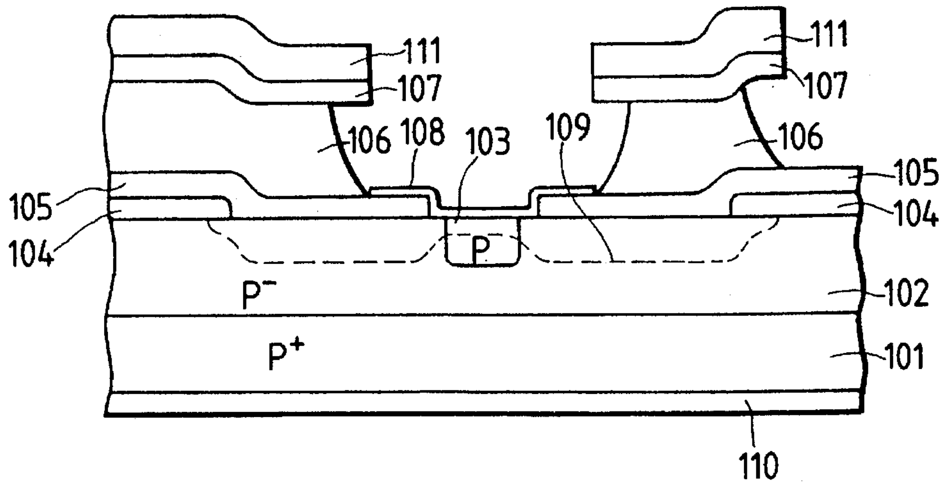
FIG. 1 is a sectional view for explaining a structure of a conventional electron emission element.

An electron emission element and a method of manufacturing the same, which can achieve the objects of the present invention, will be described hereinafter.

In order to achieve the above objects, one preferred electron emission element of the present invention comprises: a semiconductor substrate of a first conductivity type; a semiconductor layer of the first conductivity type formed on the semiconductor substrate of the first conductivity type and having an impurity concentration for causing an avalanche breakdown; a Schottky electrode for forming a Schottky junction with the semiconductor layer of the first conductivity type; means for applying a reverse bias voltage across the Schottky electrode and the semiconductor layer of the first conductivity type to cause the Schottky electrode to emit electrons; and a lead electrode for externally guiding the emitted electrons, wherein the semiconductor layer of the first conductivity type has a high-concentration doping region of the first conductivity type, the high-concentration doping layer forming a Schottky junction with the Schottky electrode.

In the above structure, the semiconductor substrate of the first conductivity type is preferably formed of GaAs or Si.

In the above structure, an impurity concentration of the high-concentration doping region of the first conductivity type preferably falls within a range of $2\times10^{17}$ to $10\times10^{17}$ $cm^{-3}$, and an impurity concentration of a region other than the high-concentration doping region of the first conductivity type in the semiconductor layer of the first conductivity type preferably falls within the range of $2\times10^{16}$ to $10\times10^{16}$ $cm^{-3}$.

In the above structure, the thickness of the Schottky electrode is preferably set to be 0.1 μm or less.

In the above structure, the Schottky electrode is preferably formed by converting Gd into a silicide by a heat treatment, and depositing Ba or Cs for a layer having a thickness of one atom.

In the above structure, the high-concentration doping region of the first conductivity type is preferably formed by an FIB (focused ion beam).

According to the above structure, since the electron emission element can have the same structure as a Schottky junction diode, a switching delay time caused by accumulation of minority carriers can be shortened, and a modulation frequency of direct modulation can be increased.

According to the above structure, since a breakdown at an edge is improved and the electron emission section is restricted by forming the high-concentration doping region using a MOLD (metal-overlap laterally-diffused) structure (Solid-State Electronics, 1977, vol. 20, pp. 496–506), a guard ring structure can be omitted. Therefore, the structure of the electron emission element can be greatly simplified, and can be micropatterned.

In the above structure, since the Schottky junction formation portion requires only one ion-implantation cycle, processes can be much facilitated, and problems on processes, e.g., reliability, a variation in elements, and the like can be eliminated.

In order to achieve the above objects, an electron emission element of the present invention can be manufactured by a method of manufacturing an electron emission element comprising: at least a semiconductor substrate; a semiconductor layer formed on the semiconductor substrate and having a high-impurity concentration region for causing an avalanche breakdown, a Schottky electrode formed on the semiconductor layer; a wiring electrode for supplying a charge to the Schottky electrode; a lead electrode for externally guiding emitted electrons; and an insulating layer for electrically isolating the wiring electrode and the lead electrode, including at least the steps of:

sequentially depositing conductive layers serving as the semiconductor layer and the wiring electrode, the insulating layer, and a conductive layer serving as the lead electrode on the semiconductor substrate; forming a hole in the conductive layer serving as the lead electrode, the insulating layer, and the conductive layer serving as the wiring electrode; and performing ion implantation in the semiconductor layer through the hole to form a high-impurity concentration region.

The method preferably further includes the steps of: widening an area of the hole formed in the insulating layer and the conductive layer serving as the lead electrode; and forming a Schottky electrode which is in contact with at least the high-impurity concentration region via the hole.

In this manner, the conductive layer serving as the wiring electrode, the insulating layer, and the conductive layer serving as the lead electrode are sequentially deposited in advance, and the hole is formed in these layers at the same time (or sequentially) by etching. The high-impurity concentration region is formed in the semiconductor layer through this hole (i.e., using these layers as a mask). After this hole is widened, the Schottky electrode is formed through this hole. Thus, the high-impurity concentration region and the Schottky electrode can be prevented from causing a positional shift. For this reason, the electron emission element manufactured in this manner can improve its reliability and yield, and an alignment margin need not be increased. Therefore, an area per element can be decreased.

When the hole is formed first, etching is used as a means for forming the hole, and materials for forming the respective layers are selected so that the etching rate of a layer serving as the wiring electrode is higher than that of a layer serving the lead electrode. The respective layers are separately etched, so that the size of the hole formed in the layer serving as the wiring electrode can be larger than an area of the high-impurity concentration region. Therefore, a uniform Schottky electrode having a very small thickness can be formed on the high-impurity concentration region during formation of the Schottky electrode. Thus, an energy distribution upon emission of electrons can be greatly uniformed.

When the hole is to be widened, etching is employed as a means for widening the hole, and materials forming the respective layers are selected so that the etching rate of the insulating layer is higher than that of the layer serving as the lead electrode and the etching rate of the layer serving as the lead electrode is higher than that of the layer serving as the wiring electrode, or the respective layers are separately etched, so that the size and shape of the hole in the respective layers can be optimized. In this manner, since the hole in the respective layers is formed in the single step, or since the holes in the respective layers are sequentially formed after a single resist formation step, the size and shape of the hole in the respective layers can be optimized. Therefore, the manufacturing process can be simplified as compared to the prior art.

In order to achieve the above objects, another electron emission element of the present invention comprises: a p-type semiconductor layer; a Schottky electrode for forming a Schottky junction with the p-type semiconductor layer; means for applying a reverse bias voltage to the Schottky electrode and the p-type semiconductor layer to cause the Schottky electrode to emit electrons; and a lead electrode for externally guiding the emitted electrons, wherein an oxide film is formed around the Schottky junction portion by a LOCOS method.

In the above structure, a p-type semiconductor substrate is preferably formed of Si.

In the above structure, the p-type semiconductor layer preferably has a p-type high-concentration doping region, and the high-concentration doping region preferably forms a Schottky junction with the Schottky electrode. In this case, an impurity concentration of the p-type high-concentration doping region preferably falls within the range of $2\times10^{17}$ to $10\times10^{17}$ $cm^{-3}$, and an impurity concentration of a region other than the p-type high-concentration doping region in the p-type semiconductor layer preferably falls within the range of $2\times10^{16}$ to $10\times10^{16}$ $cm^{-3}$.

In the above structure, the thickness of the Schottky electrode is preferably set to be 0.1 μm or less.

In the above structure, the Schottky electrode is preferably formed by converting Gd into a silicide by a heat treatment, and depositing Ba or Cs as a layer having a thickness of one atom.

The p-type semiconductor layer has an impurity concentration causing an avalanche breakdown.

According to the above structure, since the electron emission element has the same structure as a Schottky junction diode, a switching delay time caused by accumulation of minority carriers can be shortened, and a modulation frequency of direct modulation can be increased.

In the above structure, since a breakdown at an edge is improved by performing element isolation using a LOCOS (local oxidation of silicon) structure (Philips Res. Rep., 25, 1970, pp. 118–132), a guard ring structure can be omitted. Therefore, the structure of the electron emission element can be much simplified and micropatterned. As described above, when the high-concentration doping region is formed using a MOLD (metal-overlap laterally-diffused) structure (Solid-State Electronics, 1977, vol. 20, pp. 496–506), the structure of the electron emission element can be further simplified and micropatterned.

Since the semiconductor substrate comprises Si, when an oxide film is formed in the manufacturing process of the electron emission element, an oxide film having a uniform thickness and a high breakdown voltage can be formed.

As described above, since the impurity concentration of the high-concentration doping region is set to fall within the range of $2\times10^{17}$ to $10\times10^{17}$ $cm^{-3}$, the electron emission efficiency can be optimized. If the impurity concentration exceeds $10\times10^{17}$ $cm^{-3}$, no avalanche breakdown occurs, but a tunnel breakdown occurs; if the impurity concentration is set to be lower than $2\times10^{17}$ $cm^{-3}$, electron production efficiency is impaired.

In order to efficiently emit electrons, the thickness of the Schottky electrode is preferably set to be 0.1 μm or less. When the thickness exceeds 0.1 μm, produced electrons collide against those in metals, lose their energies, and cannot easily pass through the electrode. However, if the electrode is too thin, since the resistance of the Schottky electrode is increased too much to be ignored, a voltage cannot be efficiently supplied to the element, and a film is destroyed by a current flowing therethrough. Thus, the thickness of the Schottky electrode is preferably set to be about 0.02 μm.

In the above structure, since the Schottky junction formation portion requires only one ion-implantation cycle, processes can be much facilitated, and problems on processes, e.g., reliability, a variation in elements, and the like can be eliminated.

An electron emission mechanism of the Schottky electron emission element will be briefly described below.

Figure 2:
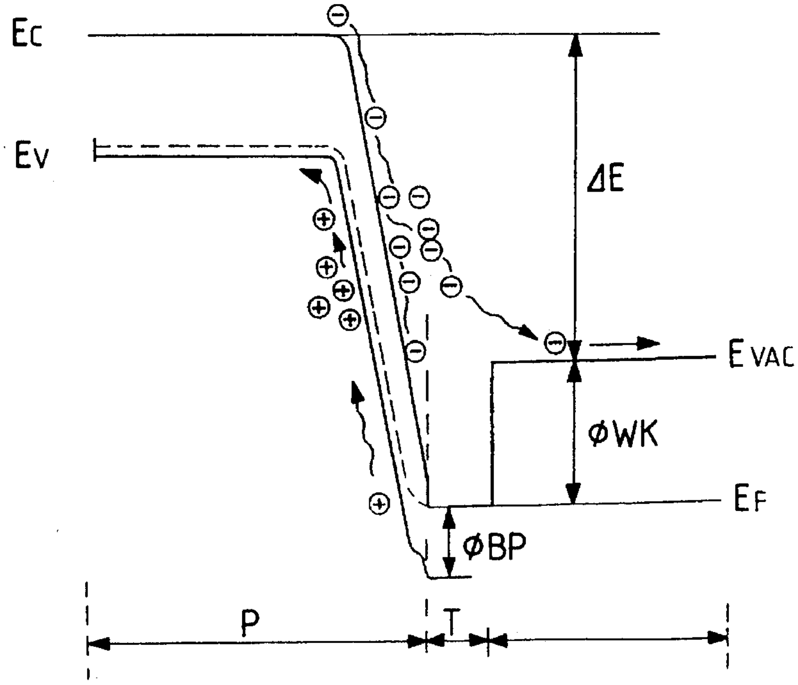
FIG. 2 is an energy band chart for explaining the operation principle of an electron emission element according to the present invention.

A Schottky diode utilizes a Schottky barrier $\phi BP$ formed at a junction portion between a p-type semiconductor and a metal, as shown in the energy band chart of FIG. 2. When a reverse bias voltage is applied to the Schottky diode, an avalanche breakdown occurs. With respect to electrons produced by the avalanche breakdown, those having an energy larger than a work function $\phi WK$ of the Schottky metal pass through the metal and are emitted into vacuum.

In order to realize such a mechanism, according to the present invention, the structure, concentration, and shape of a semiconductor are optimized so that leakage at an edge portion in formation of a Schottky diode is prevented, and an avalanche breakdown occurs at a specific position. For this reason, electrons can be extracted very efficiently.

The above objects of the present invention can be achieved by an electron emission element comprising a solid-state layer, a voltage application electrode for applying a bias to a surface of the solid-state layer, and an electron emission electrode for emitting electrons produced upon application of the bias, wherein a material for forming the electron emission electrode is a material having a lower work function than a material for forming the electrode application electrode.

In addition to the above structure, the electron emission element preferably comprises a wiring electrode for applying a voltage to the voltage application electrode.

In formation of surface electrodes of the electron emission section, since an electrode formed of a material having a lower work function than that of the voltage application electrode (to be referred to as an electron emission electrode hereinafter), an electrode for applying a voltage to the voltage application electrode (to be referred to as a wiring electrode hereinafter), and the like are formed to constitute a multi-layered electrode structure, the functions of the surface electrodes are shared, and electrode materials for the respective functions can be selected. Therefore, the electron emission element which can solve the conventional problems described above and can guarantee high electron emission efficiency can be provided.

According to the present invention, the above objects can be achieved by an electron emission element comprising:

a semiconductor substrate having a p-type semiconductor layer whose impurity concentration falls within a concentration range for causing an avalanche breakdown in at least a portion of a surface thereof, a Schottky electrode for forming a Schottky junction with the p-type semiconductor layer, means for applying a reverse bias voltage to the Schottky electrode and the p-type semiconductor layer to cause the Schottky electrode to emit electrons, and a lead electrode, formed at a proper position, for externally guiding the emitted electrons, wherein at least a portion of the Schottky electrode is formed of a thin film of a material selected from the group consisting of metals of Group 1A, Group 2A, Group 3A, and lanthanoids, metal silicides of Group 1A, Group 2A, Group 3A, and lanthanoids, metal borides of Group 1A, Group 2A, Group 3A, and lanthanoids, and metal carbides of Group 4A.

In this structure, the Schottky electrode is joined to the p-type semiconductor layer to form a Schottky diode. The impurity concentration of the p-type semiconductor layer is set to fall within a concentration range for causing an avalanche breakdown.

Similarly, this structure comprises the means for applying the reverse bias voltage to the Schottky electrode and the p-type semiconductor layer to cause the Schottky electrode to emit electrons. Note that this means is not particularly limited, and various other proper means may be employed.

This structure comprises the lead electrode, formed at a proper position, for externally guiding the emitted electrons.

In this structure, at least a portion of the Schottky electrode comprises a material selected from the group consisting of metals of Group 1A, Group 2A, Group 3A, and lanthanoids, metal silicides of Group 1A, Group 2A, Group 3A, and lanthanoids, metal borides of Group 1A, Group 2A, Group 3A, and lanthanoids, and metal carbides of Group 4A. The Schottky electrode is preferably formed to be a thin film having a film thickness of not more than 100 Å. Note that the surface (e.g., a surface opposite to a junction surface) of the Schottky electrode is partially oxidized, and an oxide of Group 1A, 2A, or 3A, or lanthanoids is formed on the top surface, thus further decreasing the work function. As a result, more stable electron emission can be performed.

In this structure, a high-concentration doping region may be formed in the p-type semiconductor layer, and a Schottky junction may be formed between the high-concentration doping region and the Schottky electrode. In this case, a depletion layer is formed to be very thin in the high-concentration doping region, and a breakdown voltage is locally decreased. In addition, an energy for producing hot electrons can be applied.

The operation of the semiconductor electron emission element of the present invention will be described again with reference to the energy band chart.

FIG. 2 is the energy band chart of the semiconductor surface of the semiconductor electron emission element.

As shown in FIG. 2, when a junction between a p-type semiconductor layer ("p" in FIG. 2 represents a p-type semiconductor layer) and the thin-film Schottky electrode ("T" in FIG. 2 represents a Schottky electrode portion) formed of the above-mentioned material is reverse-biased, a vacuum level $E_{VAC}$ can be an energy level lower than a conduction band $E_C$ of the p-type semiconductor layer, and a large energy difference $\Delta E$ ($=E_C-E_{VAC}$). When the avalanche breakdown is caused in this state, a large number of electrons which were minority carriers in the p-type semiconductor layer can be produced, and electron emission efficiency can be improved. Since an electric field in the depletion layer applies an energy to the electrons, hot electrons are produced, and a kinetic energy becomes larger than that corresponding to a temperature of a lattice system. Therefore, electrons having a potential higher than that corresponding to a work function on the surface can be emitted from the surface without causing an energy loss due to scattering.

A Schottky electrode material used in the semiconductor electron emission element of the present invention must be a material which definitely exhibits Schottky characteristics with respect to the p-type semiconductor layer. In general, a linear relationship is established between the work function $\phi_{WK}$ and the Schottky barrier height $\phi_{Bn}$ for an n-type semiconductor p274 S.M. $S_{ze}$, "Physics of Semiconductor Devices " JOHN WILEY & SON INC. 2nd Edition. As for Si, $\phi_{Bn}=0.27\phi_{WK}-0.55$, and $\phi_{Bn}$ is decreased as the work function is decreased like in other semiconductors. Since the Schottky barrier height $\phi_{Bp}$ for a p-type semiconductor and $\phi_{Bn}$ have a relationship given by about $\phi_{Bp}+\phi_{Bn}=E_g/q$, as shown in Table 1, the Schottky barrier height for the p-type semiconductor is given by $\phi_{Bp}=E_g/q-\phi B_n$. As can be calculated from the above-mentioned equation, a Schottky diode which is good for a p-type semiconductor layer can be manufactured by using a material having a low work function.

As described above, as low work function materials, metals of Group 1A, 2A, or 3A, or lanthanoids, metal silicides of Group 1A, 2A, or 3A, or lanthanoids, metal borides of Group 1A, 2A, or 3A, or lanthanoids, or metal carbides of Group 4A can be preferably used. The work functions of these materials are about 1.5 V to 4 V, and these materials can form Schottky electrodes good for a p-type semiconductor layer. These Schottky electrode materials can be deposited on a semiconductor with very good controllability by, e.g., electron beam deposition. When these materials are deposited to have a film thickness of 100 Å or less, hot electrons produced near the Schottky junction can pass through the Schottky electrode without considerably losing their energies. Thus, stable electrode emission can be performed. Examples of Schottky materials and values of their work functions $\phi_{WK}$ are summarized in Table 2 below.

When the above-mentioned Schottky electrode is used, a better Schottky semiconductor electron emission element can be obtained.

TABLE 1

Schottky Barrier Heights of Silicides For Si

| Schottky Material | $\phi_{Bn}$ | $\phi_{Bp}$ | $\phi_{Bn}+\phi_{Bp}$ |
|---|---|---|---|
| $YSi_{1.7}$ | 0.39 | 0.75 | 1.14 |
| $GdSi_2$ | 0.37 | 0.71 | 1.08 |
| $DySi_2$ | 0.37 | 0.73 | 1.10 |
| $HoSi_2$ | 0.37 | — | — |
| $ErSi_2$ | 0.39 | 0.7 | 1.09 |

TABLE 2

| Low Work Function Materials | |
|---|---|
| Schottky Material | $\phi_{WK}$ |
| $LaB_6$ | 2.6 |
| $GdB_6$ | 4.02 |
| $SmB_6$ | 4.4 |
| $BaB_6$ | 3.45 |
| $CaB_6$ | 2.86 |
| $SrB_6$ | 2.67 |
| $YB_6$ | 3.45 |
| $CeB_6$ | 2.93 |
| $GdB_4$) | 3.27 |
| $YB_4$ | 2.08 |
| TiC | 3.8 |
| ZrC | 3.5 |
| HfC | 3.4 |

In still another electron emission element, which can achieve the objects of the present invention, and has a semiconductor substrate having a p-type semiconductor layer whose impurity concentration falls within a concentration range for causing an avalanche breakdown in at least a portion of a surface thereof, a Schottky electrode for forming a Schottky junction with the p-type semiconductor, means for applying a reverse bias voltage to the Schottky electrode and the p-type semiconductor layer to cause the Schottky electrode to emit electrons, and a lead electrode, formed at a proper position, for externally guiding the emitted electrons, the element comprises a portion formed in a portion in the Schottky junction portion of the semiconductor layer and having a concentration range and a layer structure for locally lowering a breakdown voltage than other portions (to be referred to as a low-breakdown voltage portion), and an n-type region formed around the low-breakdown voltage portion to isolate the low-breakdown voltage portion on the surface of the semiconductor substrate, and the Schottky electrode has a small thickness which is sufficient to pass electrons produced in a depletion layer of the Schottky junction in the avalanche breakdown.

This structure has the semiconductor substrate having the p-type semiconductor layer whose impurity concentration falls within a concentration range for causing the avalanche breakdown in at least a portion of the surface thereof. The semiconductor substrate can comprise a Si substrate, a GaAs substrate, or the like.

In the above structure, the Schottky junction between the p-type semiconductor layer and the Schottky electrode is formed to be parallel to the surface of the semiconductor substrate.

The Schottky junction between the p-type semiconductor layer and the Schottky electrode is preferably formed to be parallel to or substantially parallel to the surface of the semiconductor substrate.

The electrical insulating layer having at least one opening is preferably formed on the surface of the semiconductor substrate to be parallel to or substantially parallel to the Schottky junction.

At least one lead electrode for decreasing the work function of the Schottky electrode is preferably formed on the electrical insulating layer at the edge portion of the opening.

When the Schottky junction is formed to be parallel to the surface of the semiconductor substrate, a depletion layer and an electric field are formed to be parallel to the semiconductor surface, and electrons are aligned in a direction perpendicular to the electric field, i.e., vectors are aligned outwardly from the interior of the semiconductor. For this reason, since a spread of an energy distribution of electrons is reduced, the spread of the energy distribution of emitted electrons is also reduced. As a result, an electron beam advantageous for convergence, or the like, can be obtained.

As a material of the Schottky electrode, a material having a conductivity and a low work function is preferable. For this reason, a multi-layered structure of a conductive material and a low-work function material may be employed, as described above. For example, when the Schottky electrode is constituted of one layer, borides such as $LaB_6$, $BaB_6$, $CaB_6$, $SrB_6$, $CeB_6$, $YB_6$, $YB_4$, and the like can be used.

The Schottky electrode need only have a small thickness which is sufficient to pass electrons generated in the depletion layer of the Schottky junction in the breakdown state. For example, the thickness of the Schottky electrode is preferably set to be 0.1 μm or less.

Note that the low-breakdown voltage portion can be formed by performing local high-concentration doping in the p-type semiconductor layer.

When a region is formed by performing local high-concentration doping in the p-type semiconductor layer, a very thin depletion layer is formed in the high-concentration doping region to locally decrease the breakdown voltage, and an energy for producing hot electrons in the high electric field can be applied.

The width of the high-concentration doping p-type region is preferably set to be 5 μm or less. Thus, a heat breakdown of the element caused by concentration of a current can be prevented.

In this structure, the electrical insulating layer comprising at least one opening is formed on the surface of the semiconductor substrate to be parallel to the Schottky junction portion, and at least one lead electrode for decreasing the work function of the Schottky electrode is formed at the edge portion of the opening on the electrical insulating layer.

Thus, as a result of a strong electric field generated via the lead electrode near the Schottky electrode surface, the work function is apparently decreased (to obtain a Schottky effect), and spatial charges can be prevented from being formed.

Note that the insulating layer may comprise a one- or two-layered structure. More specifically, the insulating layer may comprise a two-layered structure of silicon oxide and silicon nitride.

Note that the shape of the opening may be circular or may be a preferred one, e.g., square or rectangle for a display use. When the circular opening is used, the lead electrode can be formed into an annular shape.

The material of the lead electrode can be, e.g., gold. Note that the lead electrode may comprise a one- or multi-layered structure.

The lead electrode can be divided into two or more sub-electrodes to provide a lens function and a deflection function.

The ratio of the diameter of the opening to the thickness of the insulating layer is preferably set to be 2:1 or less.

With this ratio, a high electric field is formed near the Schottky electrode, so that electrons can be effectively guided and the work function can be decreased by the Schottky effect.

According to the present invention, an n-type region for isolating the low-breakdown voltage portion on the surface of the semiconductor substrate is formed around the low-breakdown voltage portion.

When the n-type region is formed around the Schottky electrode, leakage at the edge portion of the Schottky electrode caused by a high electric field can be prevented, as described in "THE BELL SYSTEM TECHNICAL JOURNAL", February, 1968, pp. 195–208.

Since the Schottky electrode is formed of the low-work function material which is stable and conductive in air, a depletion layer can be formed on only a semiconductor side, and velocity vectors of electrons can be aligned in a direction perpendicular to the semiconductor surface, thereby reducing the width of an energy distribution of emitted electrons. When the Schottky electrode is formed by electron beam deposition, it can be formed to be very thin, and scattering of electrons occurring when the electrons pass through the Schottky electrode can be suppressed, and handling in air can be greatly facilitated.

The above-mentioned electron emission element can be formed by a method comprising the steps of: covering, with an insulating layer, a surface of a high-concentration p-type semiconductor substrate on which a low-concentration p-type semiconductor layer is grown; forming a hole in a portion serving as an n-type region by etching and doping donor ions; doping acceptor ions via the insulating layer to form a high-concentration p-type region; annealing the resultant structure while leaving the insulating layer to form a contact electrode on the insulating layer; forming an lead electrode formation insulating layer; forming a lead electrode on the insulating layer; forming an opening in the lead electrode; patterning the lead electrode formation insulating layer by etching to expose the surface of the semiconductor layer; and forming a Schottky electrode using the formed opening as a mask.

In this manufacturing method, the high-concentration p-type region serving as the electron emission section is reduced in size by using an ion-implantation method, thus obtaining an ideal point electron source. Since the insulating film formed first is left until the last process, the contact electrode can be self-aligned. Since the Schottky electrode is formed last using the opening as a mask after the opening is formed, self-alignment formation of the Schottky electrode is allowed. In addition, physical and chemical changes such as oxidation, etching, and the like, which occur during a formation process of the Schottky electrode can be avoided. Since the insulating layer and the lead electrode have a multi-layered structure, a complicated lift-off shape (inverted taper) can be formed, i.e., a shape for effectively emitting electrons can be formed while avoiding charge-up.

In an electron emission element, which can achieve the above objects of the present invention, and has a semiconductor substrate having a p-type semiconductor layer whose impurity concentration falls within a concentration range for causing an avalanche breakdown in at least a portion of a surface thereof, a Schottky electrode for forming a Schottky junction with the p-type semiconductor, means for applying a reverse bias voltage to the Schottky electrode and the p-type semiconductor layer to cause the Schottky electrode to emit electrons, and a lead electrode, formed at a proper position, for externally guiding the emitted electrons, the element comprises a portion formed in a portion in the Schottky junction portion and having a concentration range and a layer structure for locally lowering a breakdown voltage than other portions (to be referred to as a low-breakdown voltage portion), and a semi-insulating region formed around the low-breakdown voltage portion to isolate the low-breakdown voltage portion on the surface of the semiconductor substrate, and the Schottky electrode has a small thickness which is sufficient to pass electrons produced in a depletion layer of the Schottky junction in the avalanche breakdown.

In this structure, the semiconductor substrate having the p-type semiconductor layer whose impurity concentration falls within a concentration range for causing an avalanche breakdown in at least a portion of its surface is preferably used. The semiconductor substrate preferably comprises a compound semiconductor substrate such as a GaAs substrate.

In this structure, the Schottky junction between the p-type semiconductor region and the Schottky electrode is formed to be parallel to or substantially parallel to the surface of the semiconductor substrate.

The Schottky junction between the p-type semiconductor region and the Schottky electrode is preferably formed to be parallel to or substantially parallel to the surface of the semiconductor substrate.

The electrical insulating layer having at least one opening is preferably formed on the surface of the semiconductor substrate to be parallel to or substantially parallel to the Schottky junction.

At least one lead electrode for decreasing the work function of the Schottky electrode is preferably formed on the electrical insulating layer at the edge portion of the opening.

When the Schottky junction is formed to be parallel to the surface of the semiconductor substrate, a depletion layer and an electric field are formed to be parallel to the semiconductor surface, and electrons are aligned in a direction perpendicular to the electric field, i.e., vectors are aligned outwardly from the interior of the semiconductor. For this reason, since a spread of an energy distribution of electrons is reduced, the spread of the energy distribution of emitted electrons is also reduced. As a result, an electron beam advantageous for convergence, or the like, can be obtained.

As a material of the Schottky electrode, a material having a conductivity and a low work function is also preferable. For this reason, a multi-layered structure of a conductive material and a low-work function material may be employed, as described above. For example, when the Schottky electrode is constituted of one layer, borides such as $LaB_6$, $BaB_6$, $CaB_6$, $SrB_6$, $CeB_6$, $YB_6$, $YB_4$, and the like can be used.

The Schottky electrode need only have a small thickness which is sufficient to pass electrons generated in the depletion layer of the Schottky junction in the breakdown state. More specifically, the thickness of the Schottky electrode is preferably set to be 0.1 μm or less.

Note that the low-breakdown voltage portion can be formed by performing local high-concentration doping in the p-type semiconductor region.

When a region is formed by performing local high-concentration doping in the p-type semiconductor region, as described above, a very thin depletion layer is formed in the high-concentration doping region to locally decrease the breakdown voltage, and an energy for producing hot electrons in the high electric field can be applied.

The width of the high-concentration doping p-type region is preferably set to be 5 μm or less. Thus, a heat breakdown of the element caused by concentration of a current can be prevented.

In addition, in this structure, the electrical insulating layer comprising at least one opening is formed on the surface of the semiconductor substrate to be parallel to the Schottky junction portion, and at least one lead electrode for decreasing the work function of the Schottky electrode is formed at the edge portion of the opening on the electrical insulating layer.

Thus, as a result of a strong electric field generated via the lead electrode near the Schottky electrode surface, the work function is apparently decreased (to obtain a Schottky effect), and spatial charges can be prevented from being formed.

Note that the insulating layer may comprise a one- or two-layered structure. More specifically, the insulating layer may comprise a two-layered structure of silicon oxide and silicon nitride.

Note that the shape of the opening may be circular or may be a preferred one, e.g., square or rectangle for a display use. When the circular opening is used, the lead electrode can be formed into an annular shape, as described above.

A material of the lead electrode may be, e.g., gold and/or palladium. Note that the lead electrode may comprise a one- or multi-layered structure.

The lead electrode can be divided into two or more sub-electrodes to provide a lens function and a deflection function.

The ratio of the diameter of the opening to the thickness of the insulating layer is preferably set to be 2:1 or less.

With this ratio, a high electric field is formed near the Schottky electrode, so that electrons can be effectively guided and the work function can be decreased by the Schottky effect.

In this structure, the semi-insulating region for isolating the low-breakdown voltage portion on the surface of the semiconductor substrate is formed around the low-breakdown voltage portion. In this case, the semi-insulating region preferably has a resistivity ρ satisfying $\rho>10^7$ Ω.cm.

As described in "IBM JOURNAL OF RESEARCH and DEVELOPMENT", November 1971, pp. 442–445, when the semi-insulating region is formed around the Schottky electrode, leakage at the edge portion of the Schottky electrode due to a high electric field can be prevented. The same effect may be obtained by forming a layer of a conductivity type different from that of the semiconductor substrate. In this case, however, when high-speed switching of the element is performed by a charge accumulation effect, an operation is delayed in a reverse-bias state. In contrast to this, in this structure wherein the semi-insulating region is formed, since no charge accumulation effect occurs, high-speed switching is assured.

A guard ring structure wherein a layer having a conductivity type opposite to that of the semiconductor substrate is not often preferable in terms of reliability of the element and reduction of a parasitic capacitance since the width of the depletion layer formed at the edge portion of the Schottky electrode is changed depending on a bias to be applied to the Schottky electrode. In contrast to this, in this structure, since the depletion layer is left unchanged at the edge portion of the Schottky electrode regardless of the bias level, high reliability can be guaranteed, and a degree of freedom on device design can be increased.

When a GaAs semiconductor substrate is used as a semiconductor substrate, GaAs can be easily semi-insulated by trapping oxygen and chromium ions in a deep level upon implantation of these ions.

In the above reference, the above-mentioned effect is obtained by forming the semi-insulating region on a silicon semiconductor by a process (LOCOS process) utilizing silicon oxide. However, according to the present invention, the semi-insulating region can be formed by only ion-implantation without requiring such a process, and the manufacture of the element can be further facilitated.

Since the Schottky electrode is formed of the low-work function material which is stable and conductive in air, a depletion layer can be formed on only a semiconductor side, and velocity vectors of electrons can be aligned in a direction perpendicular to the semiconductor surface, thereby reducing the width of an energy distribution of emitted electrons. When the Schottky electrode is formed by electron beam deposition, it can be formed to be very thin, and scattering of electrons occurring when the electrons pass through the Schottky electrode can be suppressed, and handling in air can be much facilitated.

The above-mentioned electron emission element can be formed by a method comprising the steps of:

covering, with an insulating layer, a surface of a high-concentration p-type semiconductor substrate on which a low-concentration p-type semiconductor layer is grown; forming an opening in a portion serving as a semi-insulating region and doping ions for semi-insulating the semiconductor substrate; doping acceptor ions through the insulating layer formed first to form a high-concentration p-type region; annealing the resultant structure while leaving the insulating layer formed first to form a contact electrode on the insulating layer formed first; forming a lead electrode formation insulating layer; forming a lead electrode layer on the insulating layer; forming an opening in the lead electrode layer; patterning the lead electrode formation insulating layer by etching to expose the surface of the semiconductor layer; and forming a Schottky electrode using the formed opening as a mask.

In this manufacturing method, the high-concentration p-type region serving as the electron emission section is reduced in size by using an ion-implantation method, thus obtaining an ideal point electron source. Since the insulating film formed first is left until the last process, the contact electrode can be self-aligned. Since the Schottky electrode is formed last using the opening as a mask after the opening is formed, self-alignment formation of the Schottky electrode is allowed. In addition, physical and chemical changes such as oxidation, etching, and the like, which occur during a formation process of the Schottky electrode can be avoided. Since the insulating layer and the lead electrode have a multi-layered structure, a complicated lift-off shape (inverted taper) can be formed, i.e., a shape for effectively emitting electrons can be formed while avoiding charge-up.

EXAMPLES

Example 1

A preferred example of the present invention will be described below with reference to the accompanying drawings.

Figure 3A:
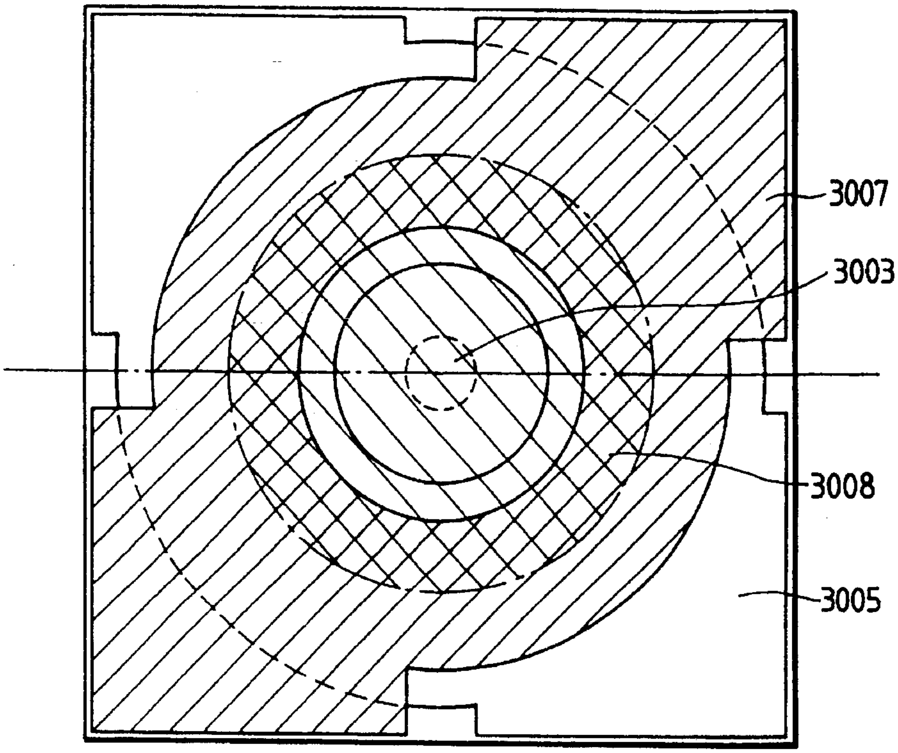
FIG. 3A is a plan view showing a semiconductor electron mission element according to Example 1 of the present invention.
Figure 3B:
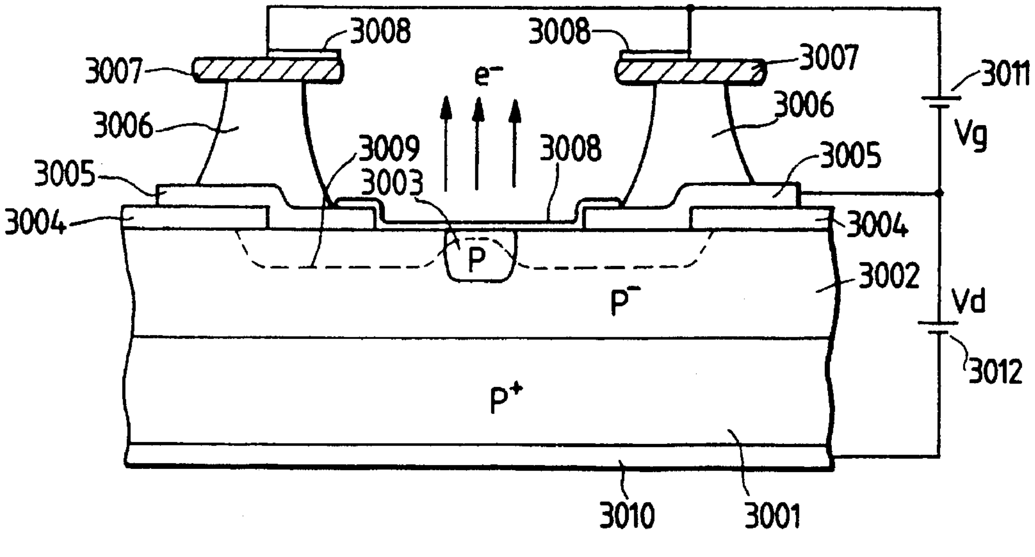
FIG. 3B is a schematic sectional view taken along an A—A section of the semiconductor electron emission element shown in FIG. 3(A)

FIGS. 3A and 3B are schematic views of a semiconductor electron emission element of this example. FIG. 3A is a schematic plan view, and FIG. 3B is a schematic sectional view taken along an A—A section of FIG. 3A.

This example will be described below in accordance with manufacturing steps.

(1) As shown in FIGS. 3A and 3B, a p-type semiconductor layer 3002 having an impurity concentration of $3\times10^{16}$ $cm^{-3}$ was epitaxially grown on a p-type semiconductor substrate 3001 (in this example, GaAs (100) was used) by MBE.

(2) Be ions were directly implanted without using a mask to have a depth of about 3,000 Å and an impurity concentration of $2\times10^{17}$ to $10\times10^{17}$ $cm^{-3}$, and the resultant structure was annealed to form a high-concentration p-type semiconductor region 3003.

(3) An oxide film was formed by sputtering, and was patterned to a desired shape using a hydrofluoric acid etchant, thereby forming an element isolation region 3004.

(4) An electrode 3005 was formed to have a thickness of 5,000 Å, and was patterned to a desired shape to be in contact with a Schottky electrode to be formed later.

(5) An insulating layer 3006 was formed by $SiO_2$ sputtering to have a thickness of about 1 μm, and a 2,000-Å thick Au film was formed by deposition as a lead electrode 3007.

(6) The Au film was patterned to an electrode shape by a lithographic resist process. Thereafter, the electrode 3007 was etched to a desired shape by Ar ion-milling.

(7) The $SiO_2$ layer 3006 was patterned by wet etching using a hydrofluoric acid etchant, thereby exposing a Schottky junction portion with a Schottky electrode 3008 to be formed in the next process.

(8) A 150-Å thick Gd film as the Schottky electrode 3008 was formed by EB deposition, thus completing an electron emission element.

In this case, a barrier height $\phi_{Bp}$ was 0.65 V, and a good Schottky diode could be obtained.

In the electron emission element manufactured in this manner, when a reverse bias voltage was applied from a power supply 3012 to the Schottky electrode 3008 and the electrode 3005, an avalanche breakdown occurred at an interface between the high-concentration p-type semiconductor region 3003 and the Schottky electrode 3008. Produced electrons passed through the very thin Schottky electrode 3008 to leak into a vacuum region, and were emitted outside the element by the lead electrode 3007.

In the electron emission element according to this example, since the high-concentration p-type semiconductor region 3003 was formed in the junction portion by using a MOLD structure, a nonuniform breakdown at an edge portion could be prevented, and a very uniform and small electron emission region could be formed.

Since the MOLD structure was employed, a p-n junction guard ring structure which was necessary in the conventional structure could be omitted. Therefore, a recovery time of the diode could be shortened, and good switching characteristics were obtained.

Note that a work function on the surface can be reduced by depositing an alkali metal such as Ba or Cs for a layer having a thickness of one atom on the surface of the Schottky electrode 3008 to extract more electrons. There is a depletion layer 3009. Reference numeral 3011 denotes an extraction voltage.

Example 2

Figure 4:
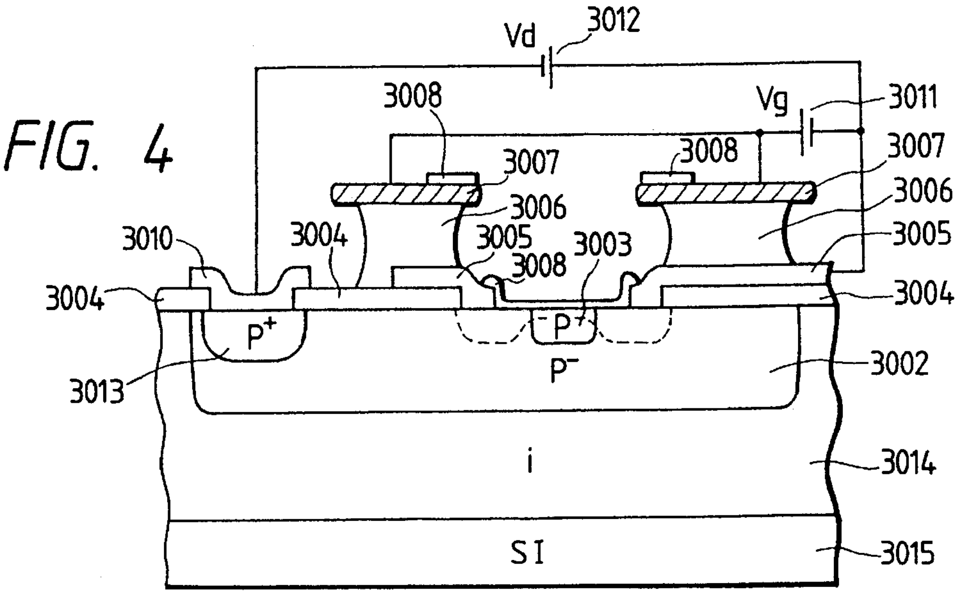
FIG. 4 is a schematic sectional view of an electron emission element according to Example 2 of the present invention.

Another preferred example of the present invention will be described below with reference to FIG. 4.

In this example, an electron emission element of the present invention is constituted to prevent a crosstalk among elements.

(1) A 3-μm thick undoped GaAs layer 3014 was epitaxially grown on a semi-insulating GaAs substrate 3015 by MBE.

(2) A p-type conductive layer 3002 was formed by an FIB so that ions were implanted to have an impurity concentration of $1\times10^{16}$ to $5\times10^{16}$ $cm^{-3}$ and a depth of about 1 μm. At the same time, Be ions were implanted to form an ohmic-contact layer 3013 having an impurity concentration of $5\times10^{18}$ $cm^{3}$ or higher, and a high-concentration p-type semiconductor region 3003 having an impurity concentration of $2\times10^{17}$ to $10\times10^{17}$ $cm^{-3}$ or higher.

(3) Thereafter, following substantially the same procedures as in Example 1, an electron emission element was completed.

In the electron emission element manufactured in this manner, when a reverse bias voltage was applied across a p-type semiconductor ohmic-contact electrode 3010 and an electrode 3005, the electron emission element could be independently controlled.

Example 3

Figure 5:
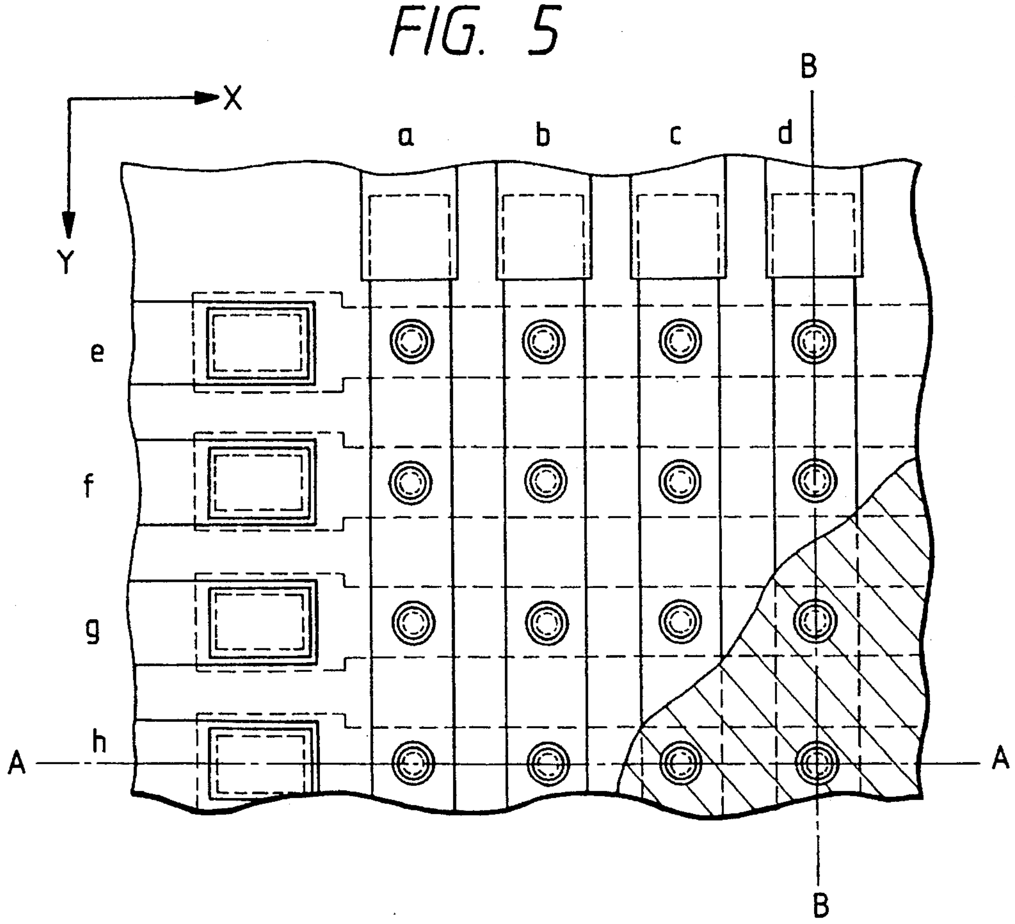
FIG. 5 is a schematic plan view showing an electron emission element according to Example 3 of the present invention.
Figure 6:
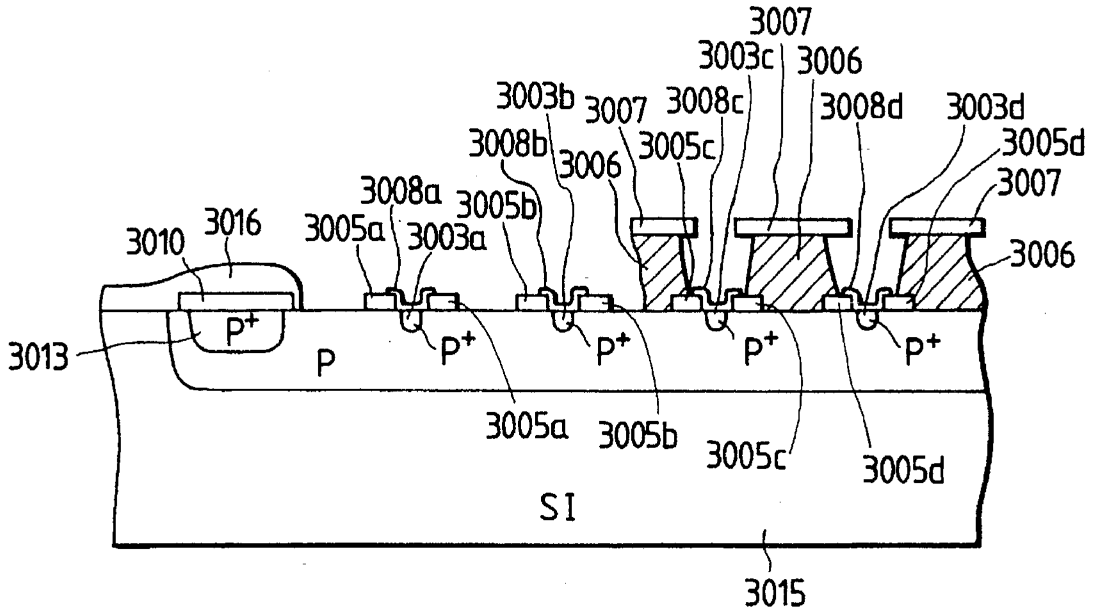
FIG. 6 is a schematic sectional view taken along an A—A section of the semiconductor electron emission element shown in FIG. 5.
Figure 7:
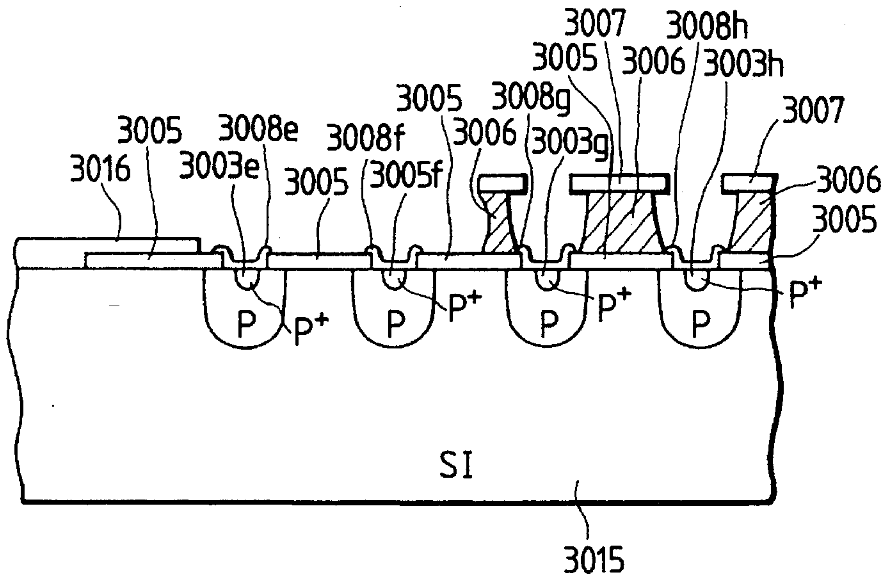
FIG. 7 is a schematic sectional view taken along a B—B section of the semiconductor electron emission element shown in FIG. 5.

Example 3 of the present invention will be explained below with reference to FIG. 5. FIG. 6 is a schematic sectional view taken along an A—A section in FIG. 5, and FIG. 7 is a schematic sectional view taken along a B—B section in FIG. 5. Note that in FIGS. 6 and 7, the structure is partially omitted.

In this example, semiconductor electron emission elements shown in Example 2 were aligned in X and Y directions to form a matrix.

The manufacturing steps were the substantially the same as those in Example 2, except that a p-type conductive layer was directly formed on a substrate without using an undoped layer.

In the electron emission elements of this example, a reverse bias voltage is applied across an arbitrary one of points (e, f, g, h) in the Y direction, and an arbitrary one of points (a, b, c, d) in the X direction, electrons can be emitted from an arbitrary point of the electron emission element matrix.

In this example, the shape of each element (shape defined by the electrode 3007) is circular but the element may have other shapes. For example, when the element matrix is used as a color display, the element shape and element intervals may be determined as needed so that three color (R, G, and B) elements can be arranged in one pixel size.

Example 4

As still another preferred example of the present invention, an electron emission element was manufactured by the following method. This method will be described below with reference to FIGS. 8A to 8D. FIGS. 8A to 8D are schematic sectional views for explaining a method of manufacturing an electron emission element according to this example.

(1) A p-type (impurity concentration of $2\times10^{16}$ $cm^{-3}$) semiconductor layer 8002 was epitaxially grown on a GaAs (impurity concentration of $5\times10^{18}$ $cm^{-3}$) p-type semiconductor substrate 8001 by MOCVD (or MBE or the like).

(2) A 3,000-Å thick AlN (aluminum nitride) film was deposited, and was patterned by a proper method, e.g., photolithography, thus forming an element isolation insulating layer 8004.

(3) A tungsten layer 8005 was deposited as a conductive layer serving as a wiring layer.

(4) An $SiO_2$ layer 8006 was deposited as an insulating layer.

(5) A polysilicon layer 8007 as a conductive layer serving as a lead electrode was deposited. FIG. 8(*a*) illustrates this state.

(6) A resist film 8011 was formed, and a hole was formed in the resist film 8011 by lithography.

(7) A hole was formed in the polysilicon layer 8007 and the $SiO_2$ layer 8006 using a $CF_4$ etching gas and the resist film 8011 as a mask.

(8) After the tungsten layer 8005 was exposed, the tungsten layer 8006 was etched using a gas such as $SF_6$, $NF_3$, $CCl_4$+20% $O_2$, or the like shown in Table 3 below as one which has a large difference between an etching rate of tungsten and that of $SiO_2$, so that the hole formed in the tungsten layer 8006 was larger than that in other layers.

Figure 8A:
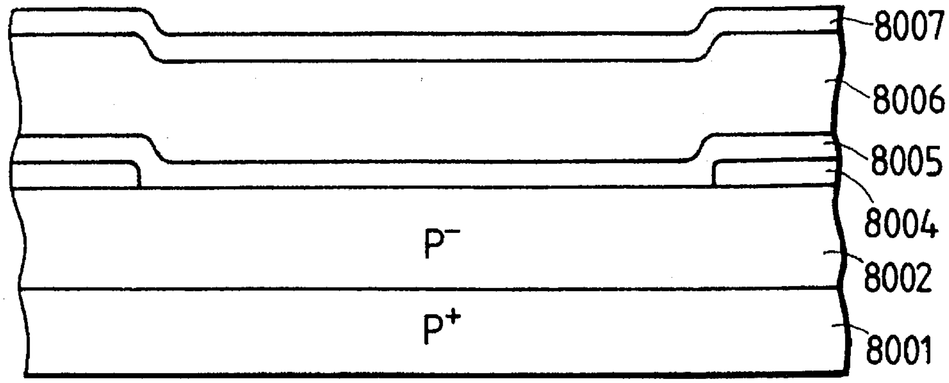
FIGS. 8A to 8D are sectional views for explaining a method of manufacturing an electron emission element according to Example 4 of the present invention.
Figure 8B:
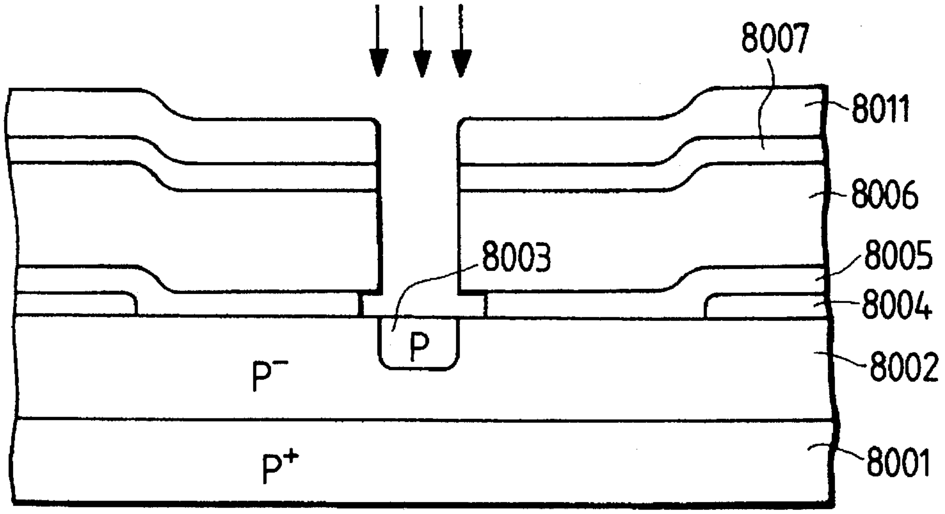
Figure 8C:
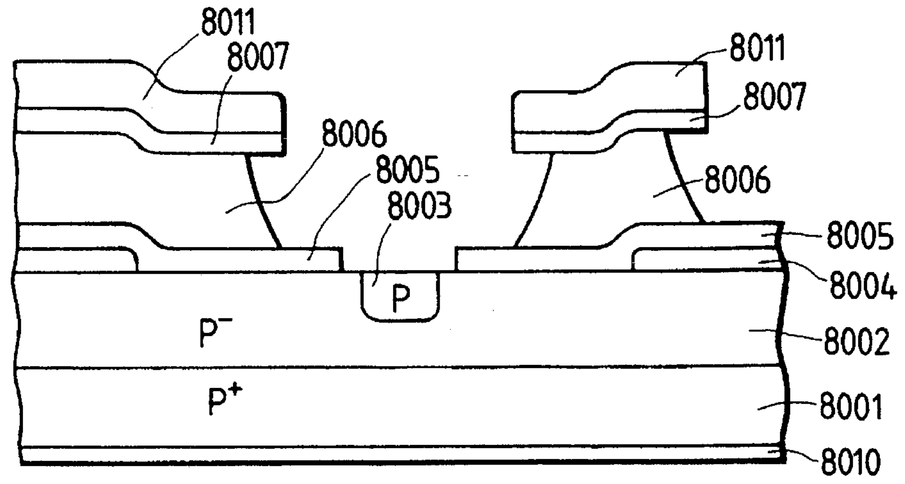
Figure 8D:
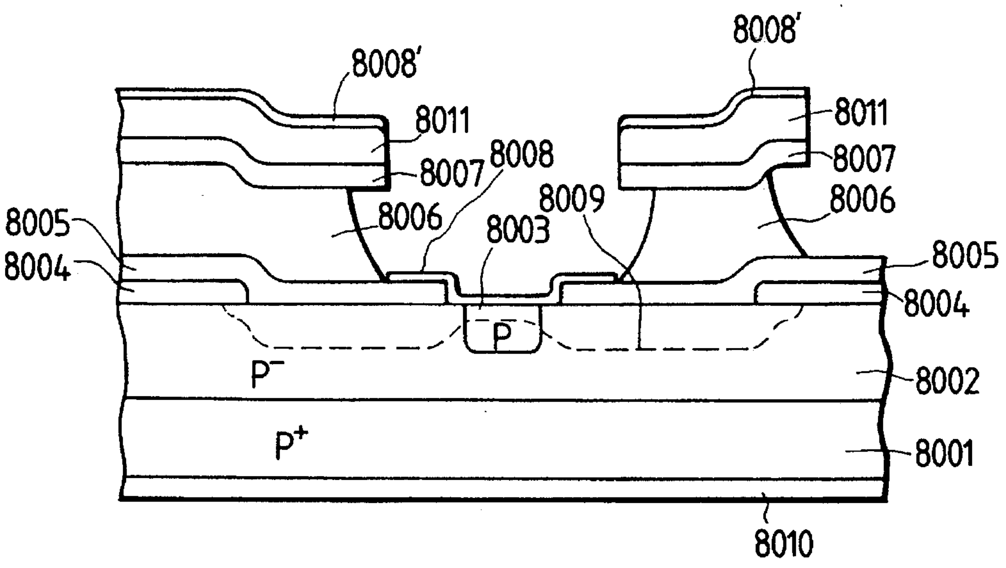

(9) Be ions were implanted in the semiconductor layer 8002 from this hole, thereby forming a p-type high-impurity concentration region 8003 having an impurity concentration of about $5\times10^{17}$ to $8\times10^{17}$ $cm^{-3}$ and a depth of about 3,000 Å. FIG. 8D illustrates this state.

(10) After the resist film 8011 was removed, the resultant structure was immediately heated in an arsine atmosphere at 700° C. for about 10 seconds, thereby activating the implanted ions.

(11) Using a new resist film 8011 as a mask, the polysilicon layer 8007 was etched by a $CF_4$ photolithographic process to widen the hole. Thereafter, the $SiO_2$ layer 8006 was then etched using a hydrofluoric acid etchant, thereby forming a tapered hole shown in FIG. 8C.

(12) A 100-Å thick Schottky electrode 8008 was formed by deposition. FIG. 8D illustrates this state. In FIG. 8D, a metal 8008' for forming the Schottky electrode 8008 was deposited on the resist film 8011.

(13) The resist film 8011 and the excessive metal 8008' were removed, thus completing an electron emission element.

The method of manufacturing the electron emission element according to this example has been described.

As described above, according to the method of manufacturing the electron emission element of this example, a photolithographic process could be simplified. Since layers formed above the p-type high-impurity concentration layer 8003 could be self-aligned with the p-type high-impurity concentration layer 8003, a small element could be formed. Since a uniform Schottky metal could be deposited on the p-type high-impurity concentration layer 8003 by using selective etching for the conductive layer 8005 serving as the wiring electrode, emitted electrons could have a very uniform energy distribution. Furthermore, since the insulating layer was subjected to selective etching, a good electron extraction system could be formed, and the Schottky electrode 8008 could serve as a good deposition mask.

Note that reference numeral 8009 denotes a depletion layer.

TABLE 3

| | RIE Characteristics by W and $SiO_2$ Gases | | | | | |
|---|---|---|---|---|---|---|
| | $SF_6$ | $CF_4$ | $NF_3$ | $CClF_3$ | $CCl_2F_5$ | $CCl_4$ + 20%$O_2$ |
| W*1 | 300 | 100 | 270 | 37 | 19 | 16 |
| $SiO_2$*2 | 6 | 50 | 68 | 37 | 32 | 4 |
| W/$SiO_2$ ratio | 50 | 2 | 2 | 4 | 0.6 | 0.6 |

*1 and *2: unit = Å/min

Etching conditions: 20 pa, electric power = 0.3 W/$cm^2$, gas flow rate = 300 cc/min Example 5

As still another preferred example of the present invention, a case will be described below wherein an Si substrate was used as a semiconductor substrate, and an oxide region 8012 formed by the LOCOS method was used as an element isolation means.

Figure 9A:
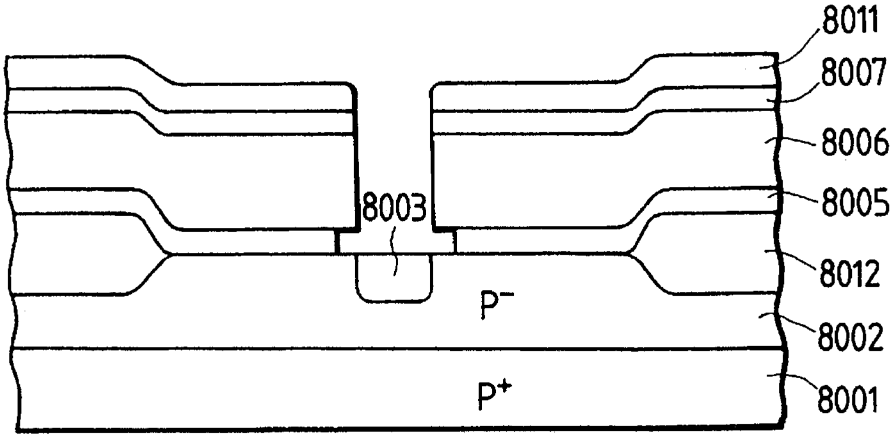
FIGS. 9A and 9B are sectional views for explaining a method of manufacturing an electron emission element according to Example 5 of the present invention.
Figure 9B:
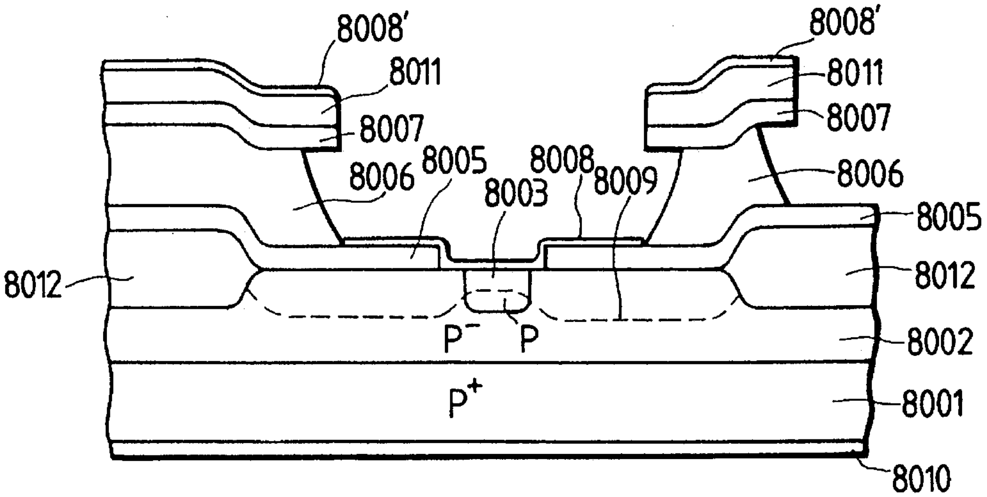

FIGS. 9A and 9B are schematic sectional views for explaining a method of manufacturing an electron emission element according to this example.

This example will be explained below in accordance with its manufacturing steps.

(1) A semiconductor layer 8002, a layer 8005 serving as a wiring electrode, an insulating layer 8006, a layer 8007 serving as a lead electrode, and an element isolation region 8012 were formed on an Si substrate 8001.

The semiconductor layer 8002, the layer 8005 serving as the wiring electrode, the insulating layer 8006, and the layer 8007 serving as the lead electrodes were formed following substantially the same procedures as in steps (1) to (5) in Example 4 described above, and the element isolation region 8012 was formed by the LOCOS method. In this example, however, an Mo (molybdenum) layer was used as the layer 8005 serving as the wiring electrode, and an Au (gold) layer was used as the layer 8007 serving as the lead electrode. Note that an $SiO_2$ (silicon oxide) layer was used as the insulating layer 8006 as in Example 4.

(2) A resist film 8011 was formed as in Example 4, and a hole for forming a p-type high-concentration region 8003 was formed in the resist film 8011. Thereafter, the Au layer 8007 was milled by an Ar ion beam using the resist film 8011 as a mask. Subsequently, the insulating layer 8006 was processed by $CF_4$, thus exposing the Mo layer 8005.

(3) The Mo layer 8005 was etched using an etchant mixture of phosphoric acid and nitric acid, thus forming a hole.

(4) B (boron) ions were implanted in the formed hole to form a p-type high-impurity concentration region 8003 having substantially the same impurity concentration and depth as those in Example 4. The resultant structure was annealed at 1,000° C. for about one minute, thereby activating B ions. FIG. 9A illustrates this state.

(5) The hole formed in the resist film 8011 was widened, and etching was then performed using an Ar ion beam and the resist film 8011 as a mask, thereby widening the hole of the Au layer 8007.

(6) The $SiO_2$ layer 8006 was etched by a hydrofluoric acid etchant, thus obtaining a tapered shape.

(7) Thereafter, following the same procedures as in Example 4, a state illustrated in FIG. 9B was obtained.

(8) Finally, the resist film 8011 and a metal film 8008' were removed, thereby completing an electron emission element.

The electron emission element according to this example has been described.

With this manufacturing method, the photolithographic process could be simplified as in Example 4, and a micro-patterned element could be formed. In addition, an energy distribution of emitted electrons could be made uniform, a good electron extraction system could be formed, and a Schottky electrode 8008 could be satisfactorily deposited using the resist film 8011 as a mask.

In this example, an element could be precisely and easily isolated and formed by the LOCOS method.

Example 6

Still another example of the present invention will be described below with reference to the drawings.

Figure 10A:
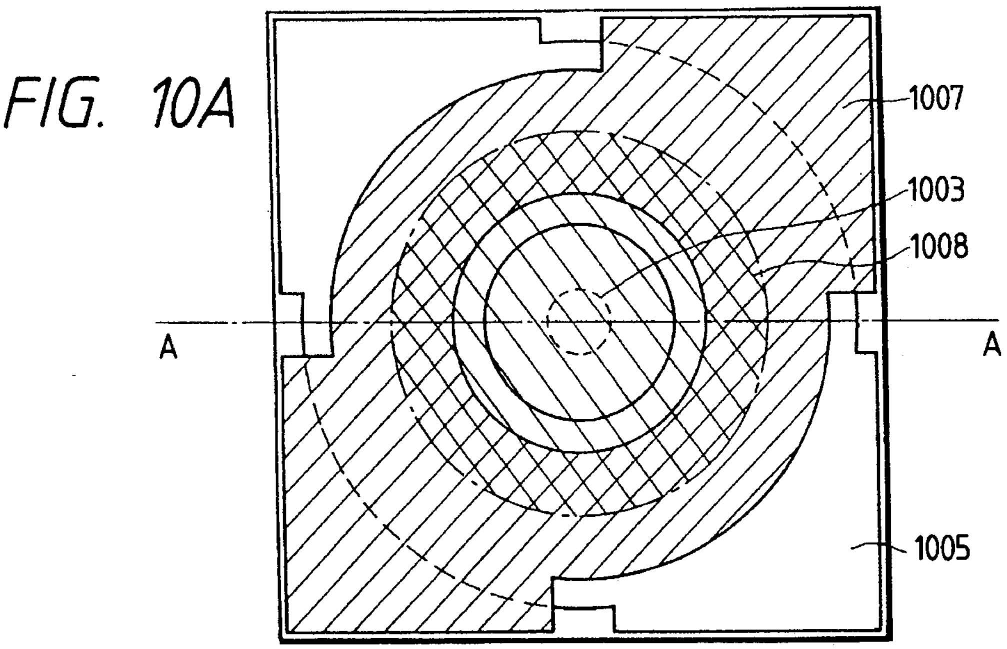
FIG. 10A is a plan view showing a semiconductor electron emission element according to Example 6 of the present invention.
Figure 10B:
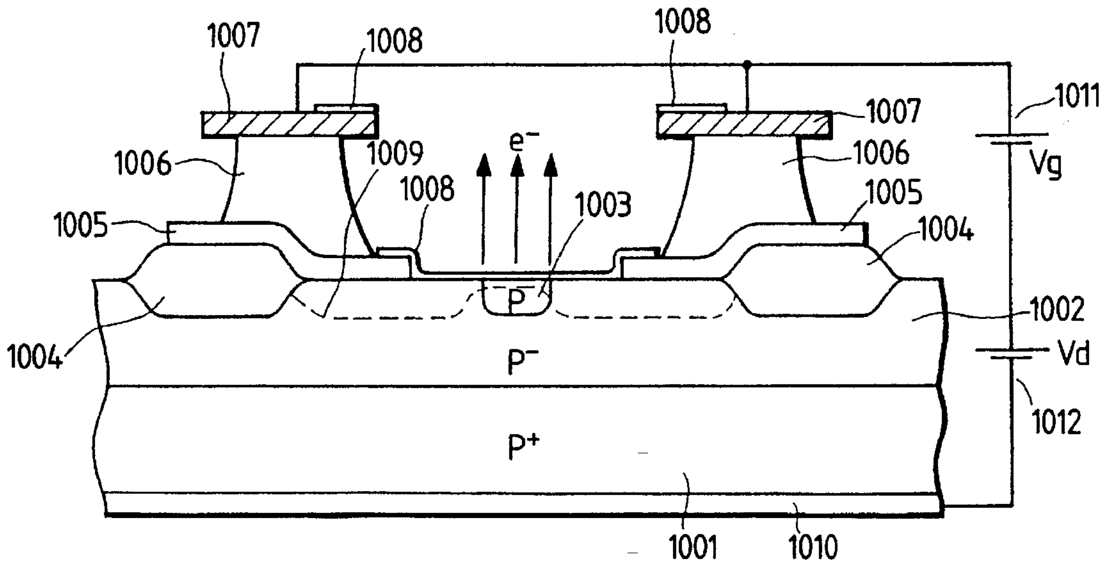
FIG. 10B is a schematic sectional view taken along an A—A section of the semiconductor electron emission element shown in FIG. 10(*a*)

FIGS. 10A and 10B are schematic views of a semiconductor electron emission element according to this example. FIG. 10A is a schematic plan view, and FIG. 10B is a schematic sectional view taken along an A—A section in FIG. 10A.

This example will be described below in accordance with its manufacturing steps.

(1) As shown in FIGS. 10A and 10B, a p-type semiconductor layer 1002 having an impurity concentration of $3\times10^{16}$ $cm^{-3}$ was epitaxially grown by CVD on a p-type semiconductor substrate 1001 (in this example, Si (100) was used). Subsequently, a thermal oxide film having a thickness of several hundreds of Å was formed.

(2) The resultant structure was appropriately patterned using a photolithographic process to form an opening in the thermal oxide film on a portion where a high-concentration p-type semiconductor region 1003 was to be formed, and B ions were then implanted to have a depth of about 3,000 Å and an impurity concentration of $2\times10^{17}$ to $10\times10^{17}$ $cm^{-3}$.

(3) A SiN film was formed by CVD, and was etched so that the SiN film was left on a portion where an element was to be formed. Furthermore, a field oxide film 1004 as an element isolation region 1004 was formed by an oxidation process (LOCOS method).

Simultaneously with formation of the LOCOS structure, the high-concentration p-type semiconductor region 1003 was activated, and a surface was then exposed by etching. Thereafter, a 5,000-Å thick electrode 1005 was formed and patterned to a desired shape so as to be in contact with a Schottky electrode which was to be formed last.

(4) A 1μm thick insulating layer 1006 was formed by $SiO_2$ sputtering. A 2,000-Å thick Au film as a lead electrode 1007 was then formed by deposition.

(5) The Au film was patterned into an electrode shape by a lithographic resist process, and an electrode 1007 was etched into a desired shape by Ar ion milling.

(6) The $SiO_2$ layer 1006 was patterned by hydrofluoric acid wet etching, thus exposing a Schottky junction portion.

(7) A 150-Å thick Gd film serving as a Schottky electrode 1008 was formed by EB deposition, and was subjected to a heat treatment at 350° C. for 5 minutes to be converted to $GdSi_2$, thus completing an electron emission element.

A barrier height $\phi_{Bp\ was}$ 0.7 V and a good Schottky diode could be obtained.

In the electron emission element manufactured in this manner, when a reverse bias voltage was applied from a power supply 1012 to the p-type semiconductor layer 1002, the Schottky electrode 1008, and the electrode 1005, an avalanche breakdown occurred at an interface between the high-concentration p-type semiconductor region 1003 and the Schottky electrode 1008. Produced electrons passed through the very thin Schottky electrode 1008 to leak into a vacuum region, and were emitted outside the element by the lead electrode 1007.

In the electron emission element according to this example, since the LOCOS method was employed as an element isolation method, the element could be precisely and easily formed.

Since the high-concentration p-type region was formed in the junction portion by using a MOLD structure, a nonuniform breakdown at an edge portion could be prevented, and a very uniform and small electron emission region could be formed.

Since the MOLD structure was employed, a p-n junction guard ring structure which was necessary in the conventional structure could be omitted. Therefore, a recovery time of the diode could be shortened, and good switching characteristics were obtained.

Note that a work function on the surface can be reduced by depositing an alkali metal such as Ba or Cs for a layer having a thickness of one atom on the surface of the Schottky electrode 3008 to extract more electrons.

Example 7

Figure 11:
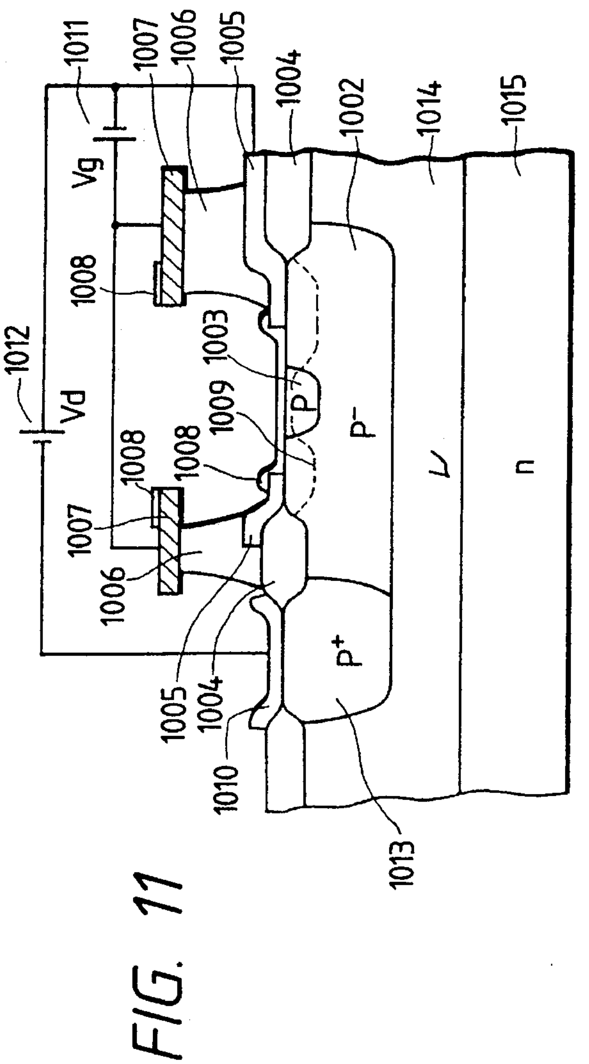
FIG. 11 is a schematic sectional view showing an electron emission element according to Example 7 of the present invention.

Still another preferred example of the present invention will be described below with reference to FIG. 11.

In this example, an electron emission element of the present invention is constituted to prevent a crosstalk among elements.

(1) A 3-μm thick layer 1014 containing almost no impurity was grown by CVD on an n-type semiconductor substrate (this embodiment used an Si (100)plane) 1015.

(2) B ions were implanted in the layer 1014 containing almost no impurity to have an impurity concentration of 1 to $5\times10^{16}$ $cm^{-3}$ and a depth of about 1 μm, thereby forming a p-type conductive layer 1002.

(3) Furthermore, B ions were implanted to have an impurity concentration of $5\times10^{18}$ $cm^{-3}$, thereby forming an ohmic-contact layer 1013.

(4) Thereafter, following substantially the same procedures as in Example 6 described above, an electron emission element was completed.

In the electron emission element manufactured in this manner, when a reverse bias voltage was applied across the p-type semiconductor ohmic-contact electrode 1010 a Schottky electrode 1008, and an electrode 1005, the electron emission element could be independently controlled.

Example 8

Figure 12:
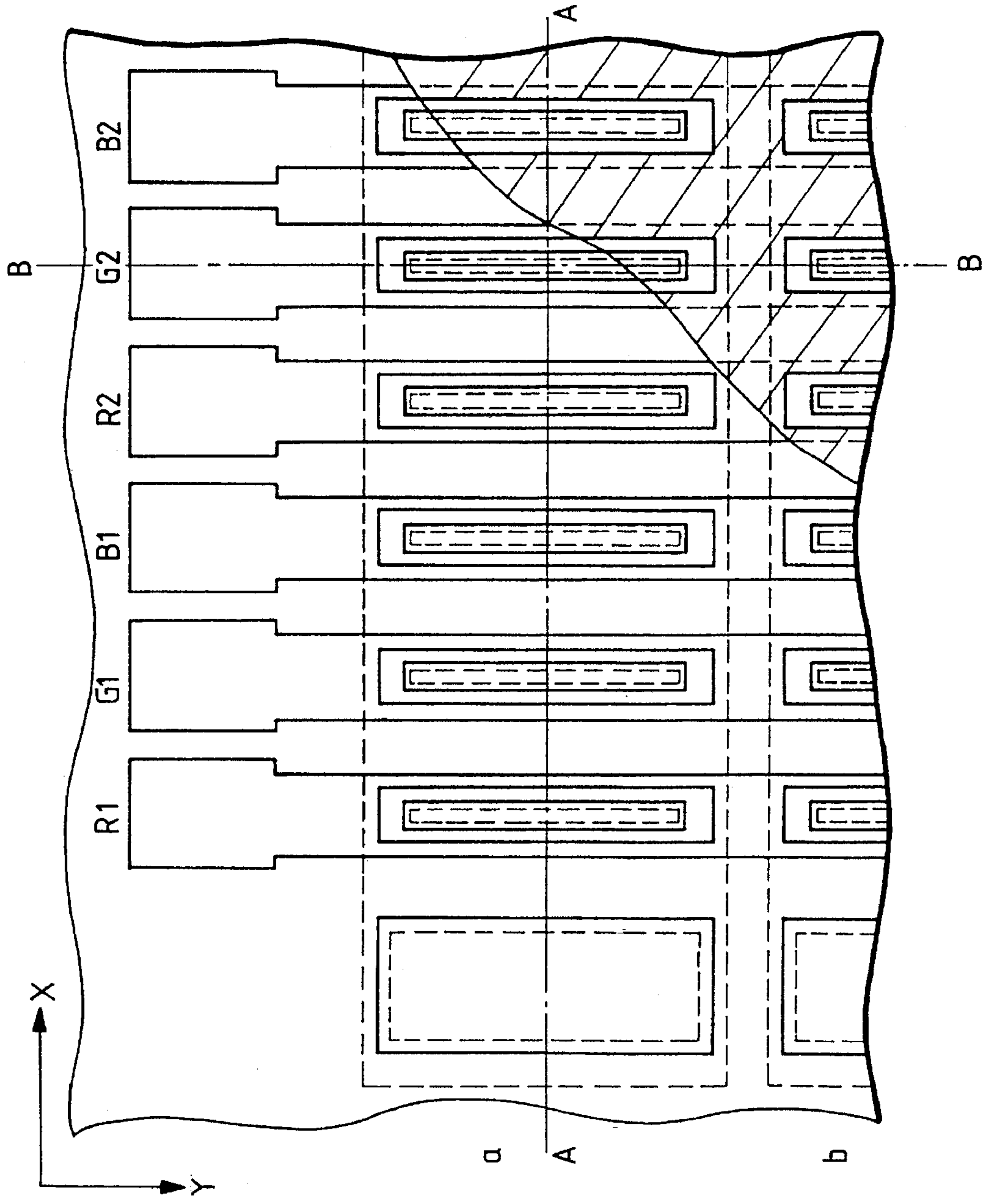
FIG. 12 is a schematic plan view showing an electron emission element according to Example 8 of the present invention.

Still another preferred example of the present invention will be described below with reference to FIG. 12.

Figure 13:
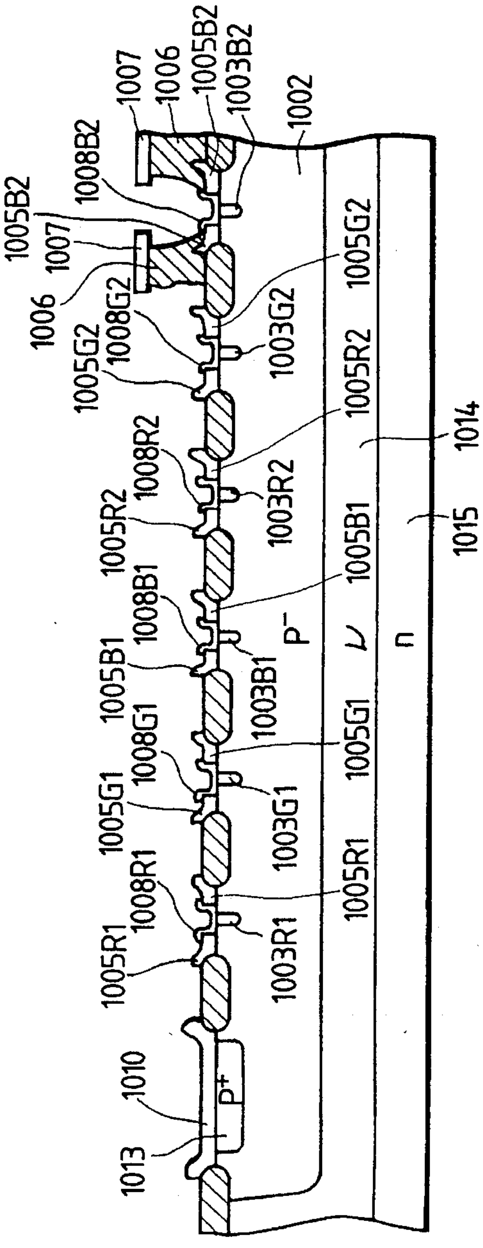
FIG. 13 is a schematic sectional view taken along an A—A section of the semiconductor electron emission element shown in FIG. 12.
Figure 14:
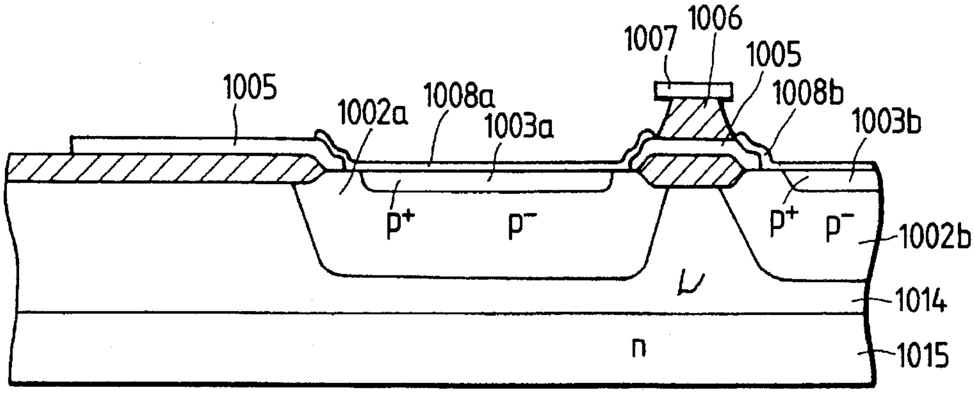
FIG. 14 is a schematic sectional view taken along a B—B section of the semiconductor electron emission element shown in FIG. 12.

In this example, semiconductor electron emission elements shown in Example 7 were aligned in X and Y directions to form a matrix. FIG. 13 is a schematic sectional view taken along an A—A section in FIG. 12, and FIG. 14 is a schematic sectional view taken along a B—B section in FIG. 12. Note that in FIGS. 13 and 14, the structure is partially omitted.

In this example, electron emission elements for three colors (R, G, and B) were arranged in one pixel size so that a color display could be constituted, and each electron emission element had a rectangular shape so that a light-emission area could be assured to be as large as possible.

The manufacturing steps were the substantially the same as those in Example 7.

In the electron emission elements of this example, a reverse bias voltage is applied across an arbitrary one of points (R1, G1, B1, R2, G2, B2) in the X direction, and an arbitrary one of points (a, b) in the Y direction, electrons can be emitted from an arbitrary point of the electron emission element matrix.

Example 9

A semiconductor electron emission element using an avalanche breakdown will be exemplified below as still another preferred example of the present invention.

Figure 15:
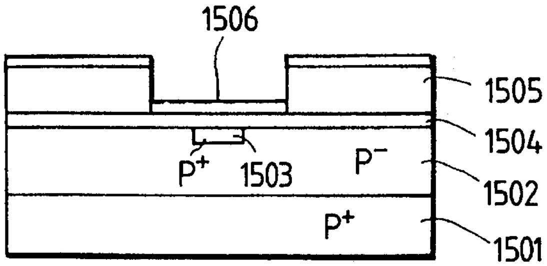
FIG. 15 is a schematic sectional view showing an electron emission element according to Example 9 of the present invention.

FIG. 15 is a schematic sectional view for explaining an electron emission element according to this example.

The structure of the electron emission element according to this example will be described below with reference to FIG. 15.

In FIG. 15, a p-type GaAs layer 1502 having an impurity concentration of $1\times10^{16}$ $cm^{-3}$ is formed by MBE (molecular beam epitaxy) on a $p^+$-type GaAs substrate 1501 having an impurity concentration of $5\times10^{18}$ $cm^{-3}$. Be ions are implanted in the p-type GaAs layer 1502 by using an FIB (Focused Ion Beam) device to form a 4-μm wide $p^+$-type layer 1503. A 10-nm thick tungsten Schottky electrode 1504 is formed on the p-type GaAs layer 1502 by sputtering. Furthermore, a wiring electrode 1505 which is formed of a low-electrical resistance material to prevent a voltage drop in a current concentration region and is formed near the electron emission region 1503 (about 4 μm), and an electron emission electrode 1506 which is formed of a low-work function material to increase electron emission efficiency and has a thickness of 10 nm or less are formed on the Schottky electrode 1504.

In order to perform electron emission from the electron emission electrode 1506 in the electron emission element as described above, a reverse bias voltage need only be applied across the $p^+$-type GaAs substrate 1501 and the wiring electrode 1505 to cause a light-receiving layer at a Schottky interface between the Schottky electrode 1504 and the $p^+$-layer or region 1503. Since the Schottky electrode 1504 is formed of a material which can form a good Schottky interface and is thermally stable, and an energy loss caused by scattering of hot electrons produced by the avalanche breakdown near the Schottky interface is minimized to improve efficiency of the avalanche breakdown. Electrons passing through the Schottky electrode 1504 are emitted from the electron emission electrode 1506 into vacuum at high efficiency of about several %. The wiring electrode 1505 is near the $p^+$type -region 1503 so that the electrons emitted from the $p^+$-type region 1503 are not kicked by side walls of the electrode 1505, thus preventing a temperature rise of the Schottky electrode 1504 near an electron emission portion.

Steps in the manufacture of the electron emission element shown in FIG. 15 will be described below with reference to FIGS. 16A to 16E.

(1) The p-type GaAs layer 1502 was formed on the $p^+$-type GaAs substrate 1501 by MBE. In this case, an impurity concentration was $1\times10^{16}$ $cm^{-3}$.

Figure 16A:
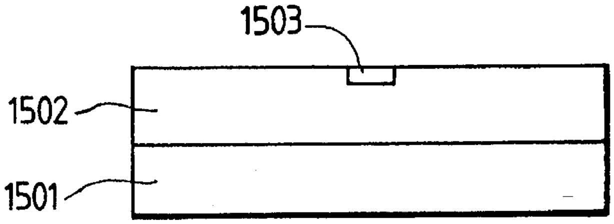
FIGS. 16A to 16E are schematic sectional views showing steps in the manufacture of the electron emission element shown in FIG. 15.

(2) Be ions were implanted in the p-type GaAs layer 1502 at an energy of 40 keV by FIB using Au, Be, and Si liquid metals as an ion source, thus forming the $p^+$-type region 1503. FIG. 16A illustrates this state. Note that the impurity concentration of the $p^+$-type region 1503 was set to be $8\times10^{17}$ $cm^{-3}$, and a depth thereof was set to be 4 μm or less. An electron emission region up to about 1 μm can be easily formed with this method using FIB.

(3) In order to activate an ion-implantation region, i.e., the $p^+$-type region 1503, capless annealing was performed in an arsine+$N_2$+$H_2$ atmosphere at 700° C. for 20 minutes.

Figure 16B:
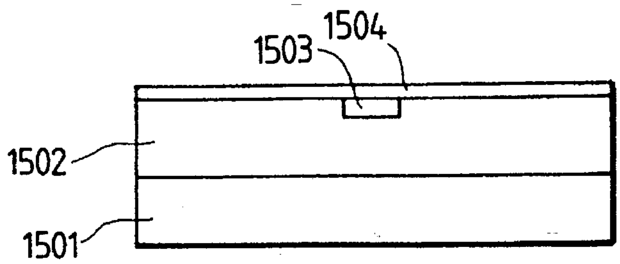

(4) A 10-nm thick tungsten (W) film was formed by sputtering as the Schottky electrode 1504. FIG. 16B illustrates this state.

Figure 16C:
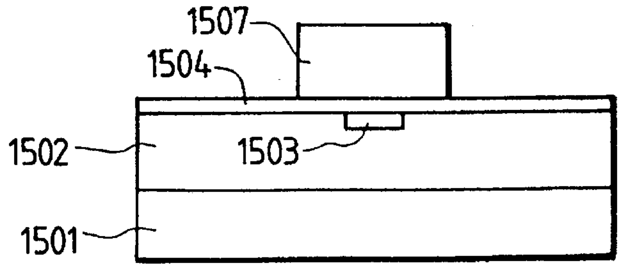
Figure 16D:
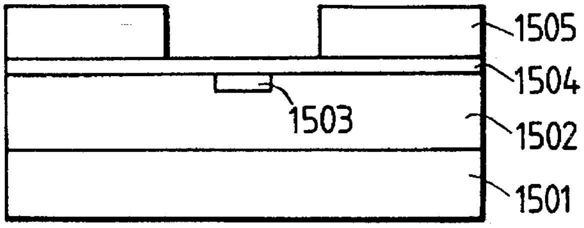

(5) A resist film 1507 was patterned, as shown in FIG. 16C, to lift off Al as the wiring electrode 1505, and the Al wiring 1505 was then formed, as shown in FIG. 16D.

Figure 16E:
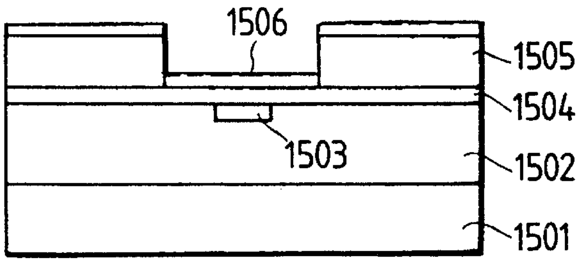

(6) The electron emission electrode 1506 was formed by Ba, Cs, $LaB_6$, Gd, TiC, and ZnC to have a thickness of 10 nm or less. FIG. 16E illustrates this state.

The steps in the manufacture of the electron emission element shown in FIG. 15 has been described.

According to the electron emission element of this example as described above, since the Schottky electrode 1504, the wiring electrode 1505, and the electron emission electrode 1506 are formed to have separate functions, suitable electrode materials can be selected, thereby optimizing characteristics.

In the above-mentioned manufacturing steps, the $p^+$-type region 1503 can also be formed by selectively implanting Be by FIB during epitaxial growth of the p-type GaAs layer 1502. The Schottky electrode 1504 may be formed by MBE. The step (5) need not always be executed in vacuum. After the structure prepared after the step (4) is temporarily taken out into air to perform the step (5), the step (6) may be performed in a vacuum cheer for performing electron emission.

In this example, the electron emission element using GaAs as a substrate material has been exemplified. In electron emission elements using Si, GaP, AlGaAs, SiC, diamond, AlN, and the like as substrate materials, the same effect as described above can be obtained.

Furthermore, the present invention is not limited to the avalanche electron emission element. For example, when the present invention is applied to an NEA type electron emission element using a Schottky electrode, an MIM electron emission element, an MIS type electron emission element, and the like, the same effect as described above can be obtained.

Example 10

As still another preferred example of the present invention, a case will be explained below wherein an electron emission element having a lead electrode or a lens electrode is manufactured.

Figure 17:
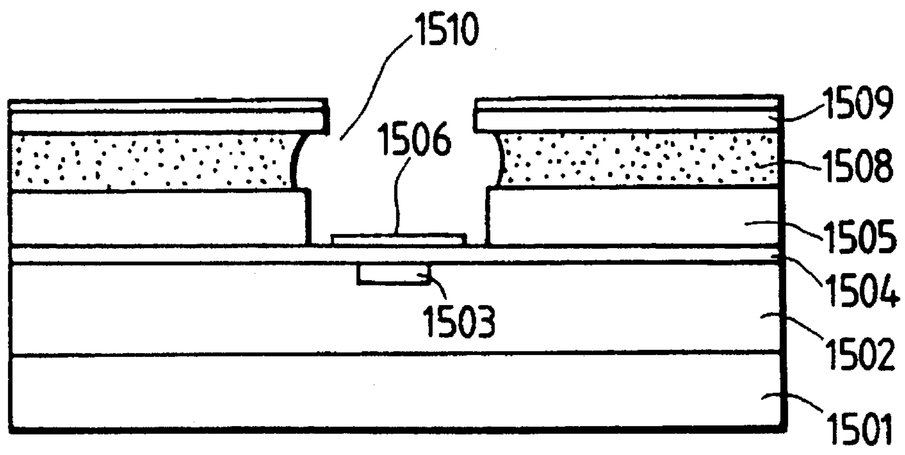
FIG. 17 is a schematic sectional view showing an electron emission element according to Example 10 of the present invention.

FIG. 17 is a schematic sectional view showing an electron emission element according to this example.

In the electron emission element according to this example, an $SiO_2$ film as an insulating layer 1508 and an Al layer as a lead or lens electrode 1509 is provided to the electron emission element of Example 9, as shown in FIG. 17.

In the electron emission element of this example, since the Schottky electrode 1504, the wiring electrode 1505, and the electron emission electrode 1506 are formed to have separate functions, suitable electrode materials can be selected, thereby optimizing characteristics like in the electron emission element of Example 9.

In addition, since the Schottky electrode 1504 is formed of a stable material in advance, its characteristics can be prevented from being degraded upon formation of a hole 1510 of an electron emission portion of the lead or lens electrode 1509. Even if the lead or lens electrode 1509 overhangs in the central direction upon formation of the low-work function material and is formed near only the $p^+$-type region, it does not influence electrical characteristics of the element, and good electron emission characteristics can be obtained.

Example 11

As still another preferred example of the present invention, a case will be described below wherein a guard ring is formed on the electron emission element to improve reverse breakdown voltage characteristics.

Figure 18:
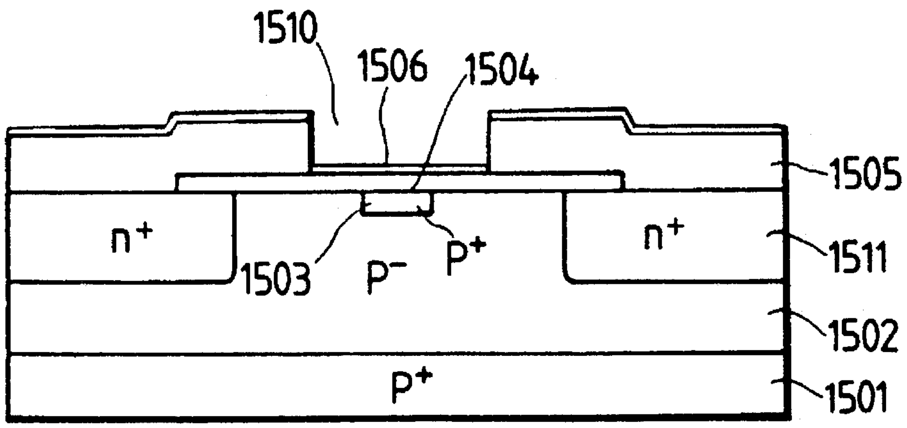
FIG. 18 is a schematic sectional view showing an electron emission element according to Example 11 of the present invention.

FIG. 18 is a schematic sectional view showing an electron emission element according to this example.

As shown in FIG. 18, in this example, an n-type region as a guard ring 1511 was formed by ion-implantation of Si using an FIB.

In the electron emission element of this example, since a Schottky electrode 1504, a wiring electrode 1505, and an electron emission electrode 1506 are formed to have separate functions, suitable electrode materials can be selected, thereby optimizing characteristics as in the electron emission element of Examples 9 and 10.

Example 12

Figure 19A:
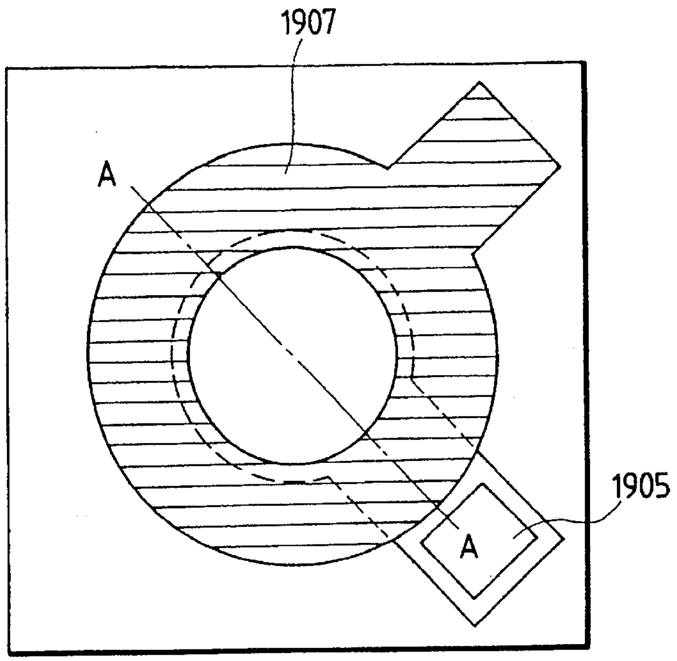
FIGS. 19A and 19B are respectively a schematic plan view and a schematic sectional view of a semiconductor electron emission element according to Example 12 of the present invention.
Figure 19B:
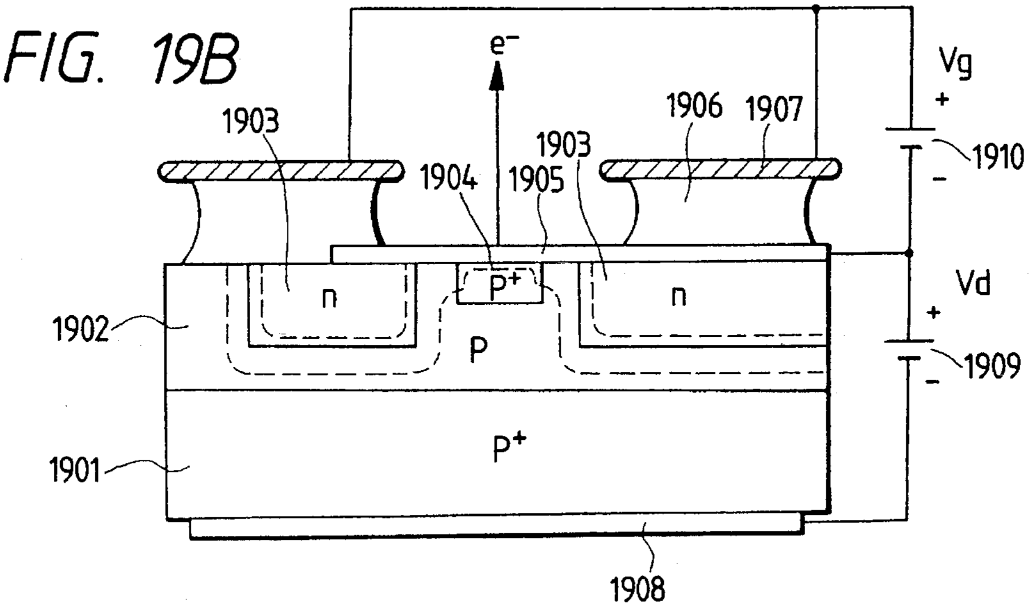

FIGS. 19A and 19B are schematic views of a semiconductor electron emission element of this example. FIG. 19A is a schematic plan view, and FIG. 19B is a schematic sectional view taken along an A—A section in FIG. 19A.

As shown in FIGS. 19A and 19B, a p-type semiconductor layer 1902 having an impurity concentration of $3\times10^{16}$ $cm^{-3}$ was epitaxially grown by CVD on a p-type semiconductor substrate 1901 (Si (100) in this example). An opening was formed in a photoresist at a predetermined position in a photolithographic resist process, and P (phosphorus) ions were implanted through the opening. The resultant structure was annealed to form an n-type semiconductor region 1903. Similarly, an opening was formed in the photoresist at a predetermined position in the resist process, and the resultant structure was annealed to form a high-concentration doping region 1904 (4 to $8\times10^{17}$ ($cm^{-3}$)).

A 100-Å thick Gd ($\phi_{WK}$=3.1 V) film as a low-work function material serving as a Schottky electrode 1905 was deposited, and was subjected to a heat treatment at 350° C. for ten minutes to be converted into $GdSi_2$. A barrier height $\phi_{Bp}$ at that time was 0.7 V, and a good Schottky diode was obtained.

A $SiO_2$ film and a polysilicon film were then deposited, and an opening for electron emission was then formed in these films using a photolithographic technique. Thereafter, a lead electrode 1907 was formed on the Schottky electrode 1905 via an $SiO_2$ layer 1906 by selective etching. An ohmic-contact electrode 1908 is formed on the other side of the p-type semiconductor substrate 1901 by depositing Al. A power supply 1909 is used to apply a reverse bias voltage $V_d$ across the Schottky electrode 1905 and the electrode 1908, and a power supply 1910 is used to apply a voltage $V_g$ across the Schottky electrode 1905 and the lead electrode 1907.

In the above structure, when the reverse bias voltage $V_d$ is applied across the Schottky diode formed by the p-type semiconductor region 1902 and the Schottky electrode 1905, an avalanche breakdown occurs at an interface between the $p^+$-type semiconductor region 1904 and the Schottky electrode 1905. Produced electrons pass through the Schottky electrode 1905 as very thin as 100 Å or less to leak into a vacuum region, and are emitted outside the element by the lead electrode 1907. As described above, according to this example, since ΔE is increased by the reverse bias voltage, the low-work function material is not limited to Cs or Cs—O but can be selected from the above-mentioned wide material range. Thus, a stabler material can be used. Since the electron emission surface serves as the Schottky electrode of the low-work function material, a surface electrode formation process can be simplified, and a highly reliable semiconductor electron emission element with high stability can be manufactured.

Example 13

Figure 20:
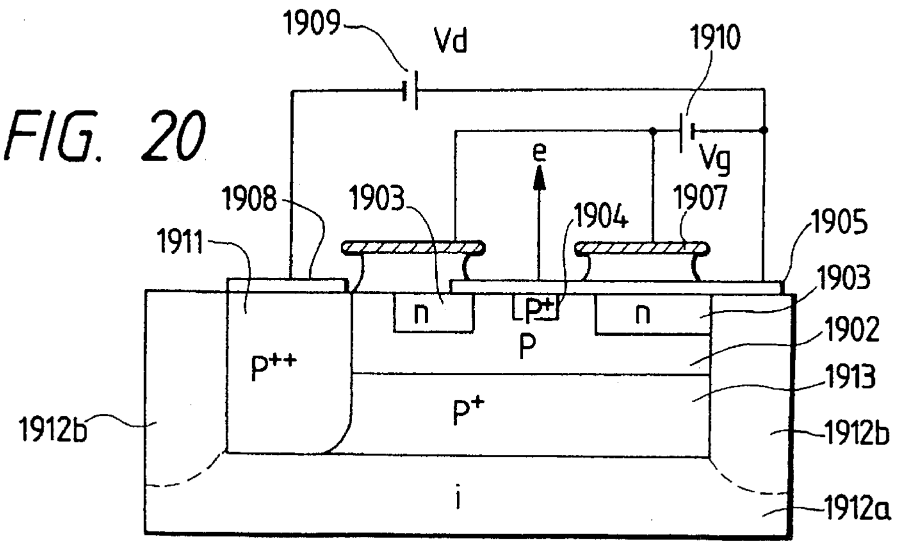
FIG. 20 is a schematic sectional view of a semiconductor electron emission element according to Example 13 of the present invention.

FIG. 20 is a schematic sectional view of still another example of a semiconductor electron emission element according to the present invention.

This example is arranged to prevent a crosstalk among elements in the semiconductor electron emission element of Example 12 described above.

Note that this example adopts $Al_{0.5}Ga_{0.5}As$ (Eg is about 1.9) to improve an electron emission efficiency.

As shown in FIG. 20, an $Al_{0.5}Ga_{0.5}As$ $p^+$-type layer 1913 was epitaxially grown while doping Be in a semi-insulating GaAs (100) substrate **1912*a* to an impurity concentration of $10^{18}$ $cm^{-3}$. Then, an $Al_{0.5}Ga_{0.5}As$ p-type layer 1902** was epitaxially grown while doping Be to an impurity concentration of $10^{16}$ $cm^{-3}$.

Then, Be ions were implanted at an acceleration voltage of about 180 keV into a deep layer by an FIB (focused ion beam) so that a p++-type layer 1911 had an impurity concentration of $10^{19}$ $cm^{-3}$ and Be ions were then implanted at an acceleration voltage of about 40 keV to a relatively shallow layer so that a $p^+$-type semiconductor layer 1904 had an impurity concentration of $5\times10^{17}$ $cm^{-3}$. Furthermore, Si ions were implanted at an acceleration voltage of about 60 keV so that an n-type semiconductor layer 1903 had an impurity concentration of $10^{18}$ $cm^{-3}$. Proton or boron ions were implanted at an acceleration voltage of 200 keV or more to form an element isolation region **1912*b***.

The resultant structure was annealed in an arsine+$N_2$+$H_2$atmosphere at 800° C. for 30 minutes. After a proper mask was formed, a 100-Å thick $BaB_6$ ($\phi_{WK}$=3.4 eV) film was deposited, and the resultant structure was annealed at a temperature of 600° C. for 30 minutes, thereby forming a Schottky electrode 1905. Following the same procedures as in Example 12 shown in FIGS. 19A and 19B, a lead electrode 1907 was formed. Finally, a surface oxidation treatment was performed to oxidize a portion ⅓ the surface layer of the $BaB_6$ film to form a BaO ($\phi_{WK}$=1.8) layer. A barrier height $\phi_{Bp}$ at that time was 0.9 V, and a semiconductor electron emission element which exhibited good Schottky characteristics and had a higher current density than Si was obtained.

According to this example, since elements are insulated from each other, a crosstalk among elements occurring when a large number of semiconductor electron emission elements are manufactured on a substrate can be eliminated, and respective elements can be independently driven. Since a wide-gap compound semiconductor is used as a semiconductor, and a borate is used on a surface, the Schottky electrode having very good contactness, a low work function, and a large Schottky barrier height can be formed, and electron emission efficiency can be increased.

Example 14

Figure 21A:
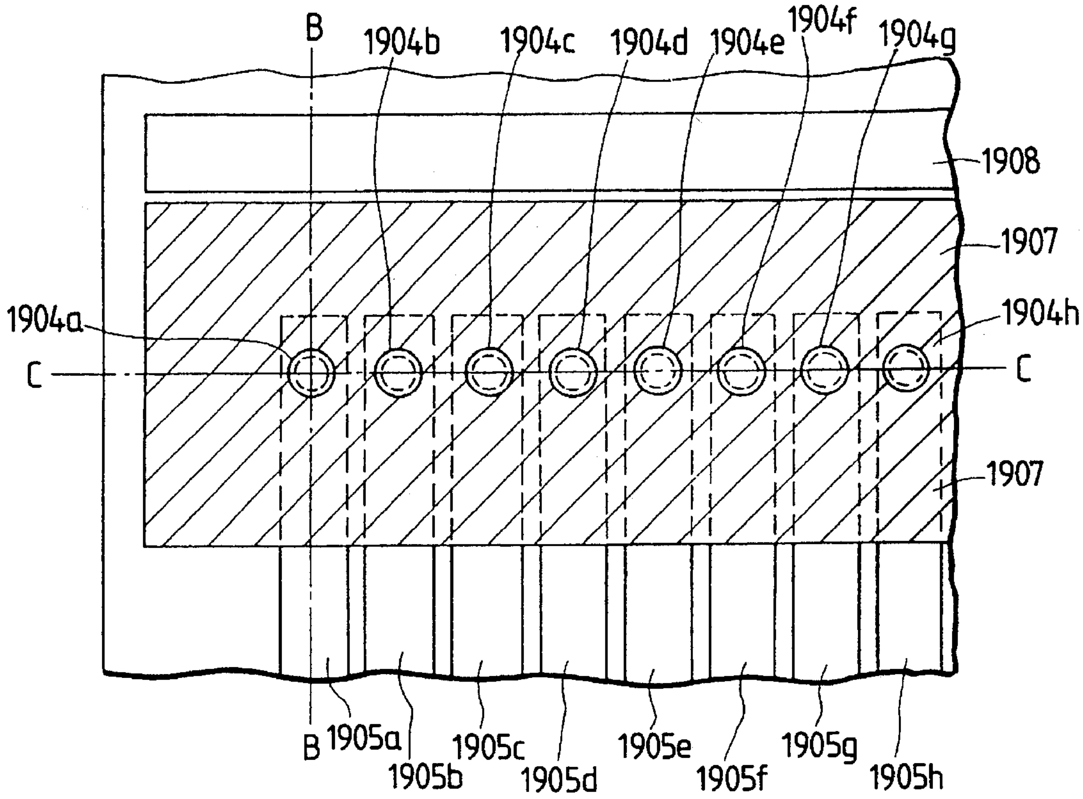
FIGS. 21A and 21B are respectively a schematic plan view and a schematic sectional view of Example 14 of the present invention in which a large number of semiconductor electron emission elements of Example 13 are linearly formed.
Figure 21B:
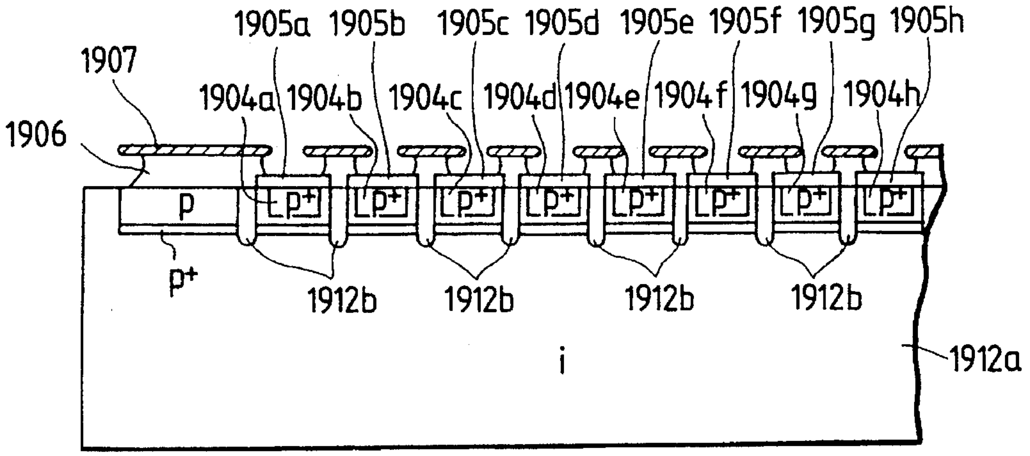

FIGS. 21A and 21B are schematic views when a large number of semiconductor electron emission elements of Example 13 are linearly formed. FIG. 21A is a schematic plan view, and FIG. 21B is a schematic sectional view taken along a C—C section in FIG. 21A.

Note that a sectional view taken along a B—B section in FIG. 21A is the same as that of Example 13 shown in FIG. 20. Since the structure of each semiconductor electron emission element is the same as that in Example 13, a detailed description thereof will be omitted.

As shown in FIGS. 21A and 21B, $p^+$-type layers **1904*a* to 1904*h*, Schottky electrodes 1905*a* to 1905*h*, and element isolation regions 1912*b* were formed on a semi-insulating GaAs (100) substrate 1912*a*** by ion implantation.

In the above structure, a large number of semiconductor electron emission elements **1904*a* to 1904*h* are linearly formed on an electron emission section, and when reverse bias voltages are respectively applied to the large number of electrodes 1905*a* to 1905*h***, respective electron sources can be independently controlled.

Example 15

Still another example of the present invention will be described below with reference to the accompanying drawings.

Figure 22A:
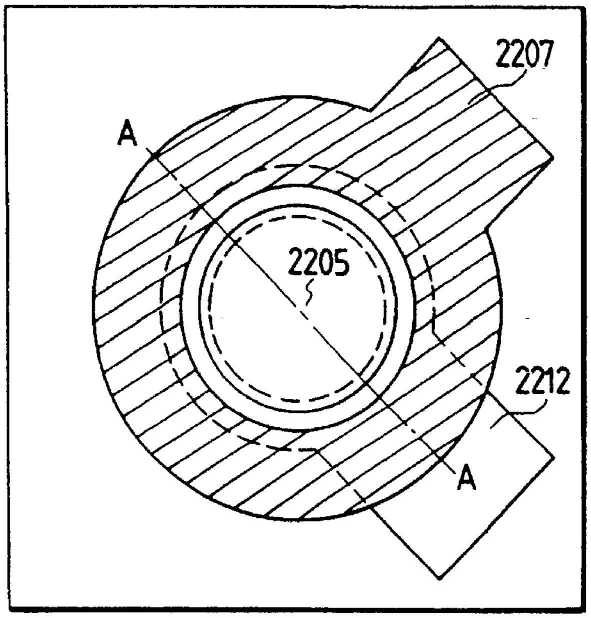
FIGS. 22A and 22B are respectively a schematic plan view and a schematic sectional view of an electron emission element according to Example 15 of the present invention.
Figure 22B:
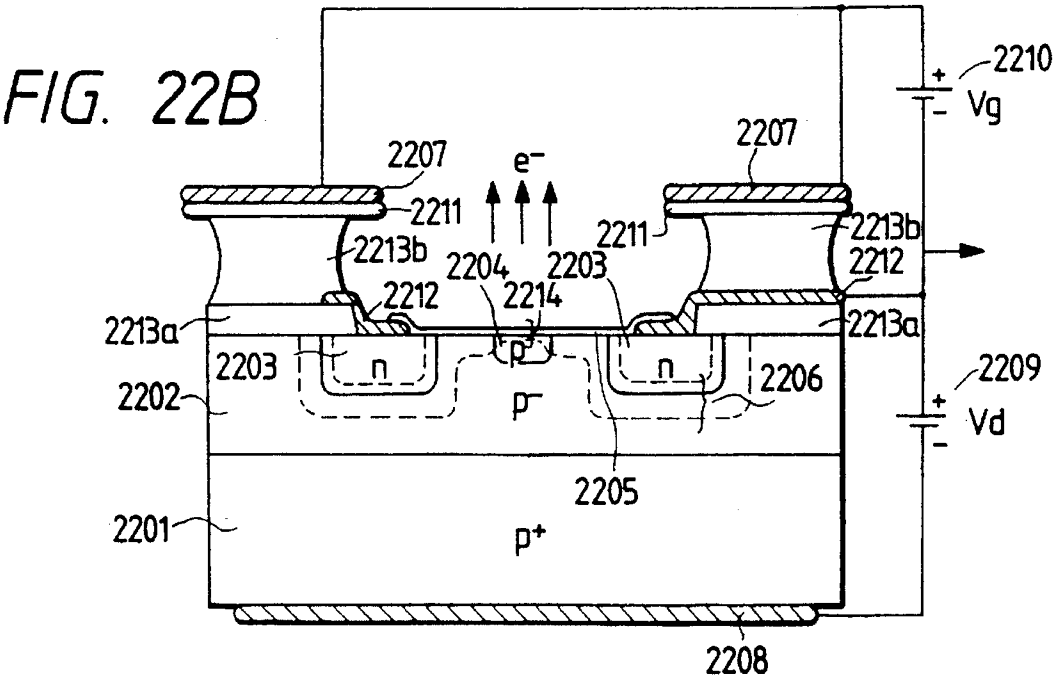
Figure 23:
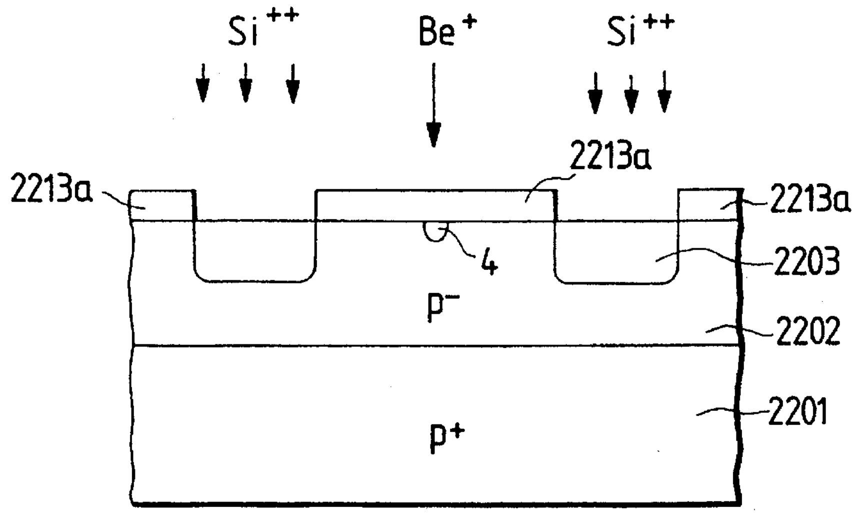
FIGS. 23, 24, and 25 are schematic sectional views showing the steps in the manufacture of the element of the present invention when viewed from the same direction as the sectional view of FIG. 22(B)
Figure 24:
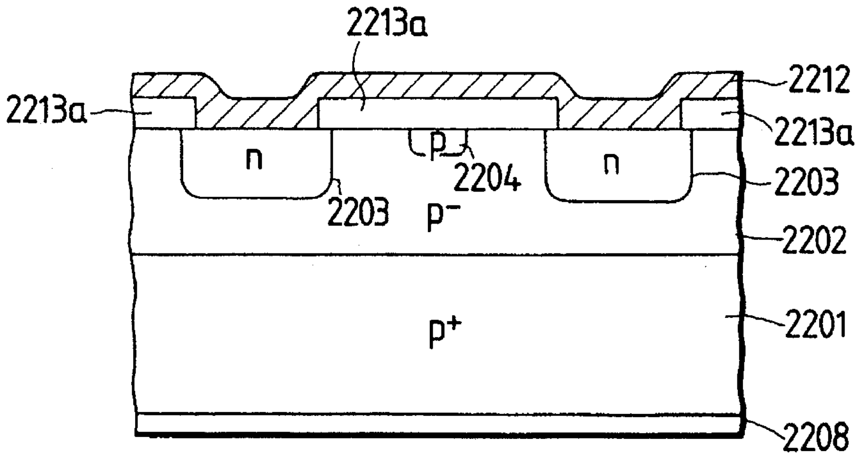
Figure 25:
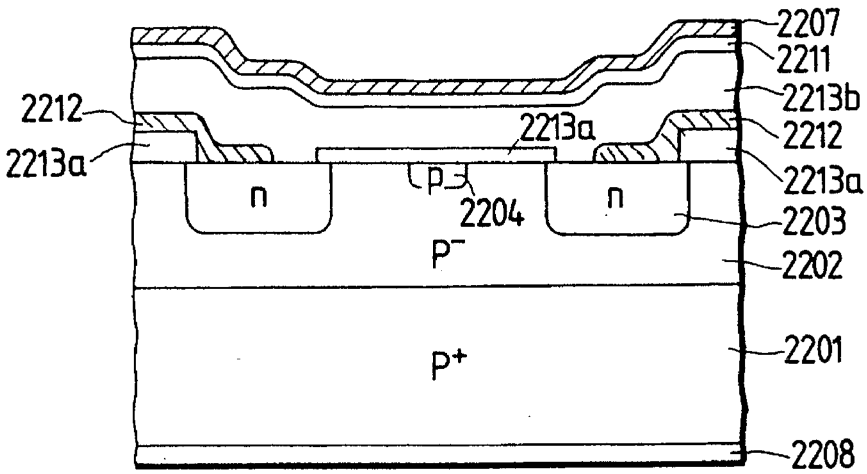

FIGS. 22A and 22B are schematic views of Example 15 of an electron emission element according to the present invention. FIG. 22A is a schematic plan view, and FIG. 22B is a schematic sectional view taken along an A—A section in FIG. 22A. FIGS. 23 to 25 schematically show the steps in the manufacture of the electron emission element shown in FIGS. 22A and 22B.

In this example, a Be-doped p-type epitaxial layer (p-type semiconductor layer) 2202 having a carrier concentration of $5\times10^{16}$ atoms/cm$^3$ was formed by MBE (molecular beam epitaxy) on a Zn-doped p-type GaAs substrate 2201 having a carrier concentration of $8\times10^{18}$ atoms/cm$^3$, and the resultant substrate was used as a material.

As shown in the schematic sectional view of FIG. 23, a 2,000-Å thick silicon nitride film **2213*a* was deposited by CVD, and was removed by proper patterning to form an n-type region. Si ions were then implanted at two different acceleration voltages of 160 keV and 80 keV by an FIB device so that an Si ion concentration was moderately decreased from the surface (to obtain an inclined junction). At the same time, Be ions were implanted at an acceleration voltage of 80 keV through a silicon nitride film 2213*a*. Since ion-implantation process was conducted in this manner, an n-type region 2203 was formed to a depth of 5,000 Å, and at the same time, a high-concentration p-type region 2204** was formed to have a depth of 2,000 Å and a diameter of 2 μ.

As described above, since maskless ion implantation is employed, multi-stage ion implantation and ion implantation of different kinds of ions can be performed, and a beam can be focused to about 1 μm. Therefore, not only the high-concentration p-type region but also the overall element structure can be manufactured on the order of submicrons, and a very small spot-like electron source can be formed.

As shown in the schematic sectional view of FIG. 24, the ion-implantation portion was appropriately annealed while leaving the silicon nitride film **2213*a*. Thereafter, an Al film was deposited, as a contact electrode 2212, on the silicon nitride film 2213*a*. According to this method, the contact electrode 2212** can be self-aligned with the n-type region formation portion.

As shown in the schematic sectional view of FIG. 25, only the Al film near the high-concentration p-type region was removed by phosphoric acid using a proper mask. A 1-μm thick silicon oxide film **2213*b* and a 2,000-Å thick silicon nitride film 2211 were deposited, and a 2,000-Å thick gold film was then deposited as a lead electrode 2207. An opening was formed on the top portion of the electron source using a resist. After the gold of the contact electrode 2207 was dissolved by an etchant mixture of potassium iodide and iodine, the silicon nitride film 2211 was patterned by $CF_4$ plasma etching. The silicon oxide film 2213*b*** was then removed by wet etching using hydrogen fluoride and ammonium fluoride. At this time, by utilizing the fact that the silicon nitride film and the silicon oxide film had considerably different etching rates during wet etching, a good tapered shape could be obtained in the lower portion of the lead electrode.

After the silicon nitride film **2213*a* near the high-concentration p-type region 2204 was removed by $CF_4$ plasma etching again, a $BaB_6$ film was deposited by EB deposition. The $BaB_6$ film was deposited to be connected to the contact electrode 2212 using an opening formed in the above-mentioned processes, thus forming a good Schottky junction. Finally, an unnecessary $BaB_6$ portion was removed together with a resist, thus completing a Schottky electron source shown in FIG. 22**B.

The structure of the electron emission element manufactured by the above-mentioned method will be described in more detail below with reference to FIGS. 22A and 22B.

In the electron emission element of this example, the high-concentration p-type region 2204 is in contact with the Schottky electrode 2205 on the semiconductor substrate to form a Schottky junction, and a reverse bias voltage is applied across the Schottky electrode to cause an avalanche breakdown, thereby producing electron-hole pairs. Electrons produced by the electron-hole pairs are emitted from the semiconductor surface. In this example, the silicon nitride film 2211 was formed on the silicon oxide film **2213*b*, and the lead electrode 2207** was formed of gold.

In this example, a low breakdown voltage is generated in a Schottky junction portion 2214 in an opening by a remaining portion of the Schottky junction. In this example, since a thin depletion layer 2206 of the is formed in the junction portion 2214, a low breakdown voltage is generated. A local decrease in breakdown voltage can be obtained by forming the high-concentration doped p-type region 2204 in the junction portion 2214. The n-type region 2203 is formed around the Schottky electrode to prevent leakage from the edge portion of the Schottky junction, thereby avoiding unnecessary current leakage.

This example has the contact electrode 2212, and the contact electrode 2212 is connected to the n-type region 2203. Since the contact electrode 2212 is formed in advance and the Schottky electrode 2205 is formed to be connected to the contact electrode 2212 in the last process, a change in Schottky characteristics and a chemical change in Schottky electrode during a manufacturing process can be prevented as compared to a case wherein a Schottky junction is formed in advance.

In this example, the Schottky electrode 2205 comprises a $BaB_6$ film having a work function of 3.4 eV. It was experimentally found that a Schottky barrier height between $BaB_6$ and p-type GaAs was $\phi_{Bp}$=0.66 V, and an effective Schottky junction could be formed. $BaB_6$ exhibited sufficient conductivity, and was formed as a 100-Å thick film by EB deposition while its stoichiometric composition ratio was left unchanged.

The p-type substrate 2201 preferably comprises a high-concentration substrate so that the ohmic-contact layer 2208 can be easily formed on its lower surface. In the example shown in FIGS. 22A and 22B, the n-type region 2203 had an impurity concentration of $1\times10^{18}$ atoms/$cm^3$, the p-type region 2204 had an impurity concentration of $7\times10^{17}$ atoms/$cm^3$ the p-type semiconductor layer 2202 had an impurity concentration of $5\times10^{16}$ atoms/$cm^3$ and the p-type substrate 2201 had an impurity concentration of $8\times10^{18}$ atoms/$cm^3$. With these concentrations, the depletion layer in the Schottky junction 2214 can have a thickness of 800 Å in a breakdown state, and a breakdown voltage of 5 V and a maximum electric field of $1\times10^6$ V/cm can be obtained. In general, electrons can gain a higher energy from an avalanche breakdown as an electric field is higher. Since the high-concentration p-type region is set to have a concentration enough to obtain a maximum electric field, i.e., a doping amount not to cause a tunnel breakdown to control a breakdown, a higher energy can be applied to electrons.

This example adopts a GaAs substrate as a semiconductor substrate. However, the element of the present invention is not limited to a GaAs substrate as a semiconductor substrate, but may be applied to silicon, silicon carbide, gallium phosphide semiconductor substrates, or the like. In particular, a material which can form a Schottky junction and has a large Schottky barrier height and a large band gap is preferable.

Example 16

Figure 26:
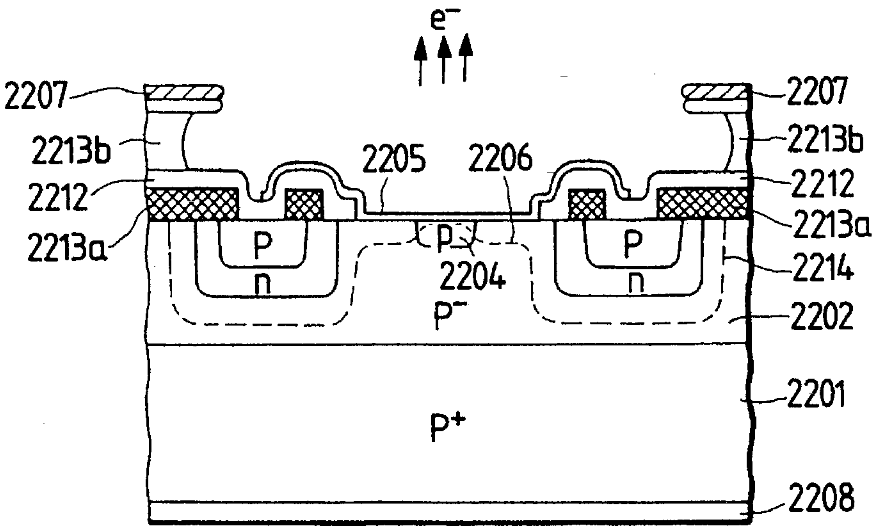
FIG. 26 is a schematic sectional view for explaining Example 16 of a semiconductor electron emission element according to the present invention.

FIG. 26 shows still another preferred example of the present invention. In this example, a guard ring corresponding to an n-type region of the element shown in FIG. 22B is formed first, and then, a p-type region is formed. Since these two semiconductor layers are formed, the depletion layer 2206 shown in FIG. 22B has a different shape, and a switching recovery time due to a charge accumulation effect can be shortened. When this element is manufactured, a p-type region is formed by ion-implanting Be ions at an acceleration voltage of 40 keV and a peak concentration of $10^{19}$ atoms/$cm^3$ or more after formation of the n-type region 2203 in the manufacturing method of Example 15. When a maskless ion-implantation process is employed, mask formation processes can be further simplified.

Example 17

Still another preferred example of the present invention will be described below with reference to the accompanying drawings.

Figure 27A:
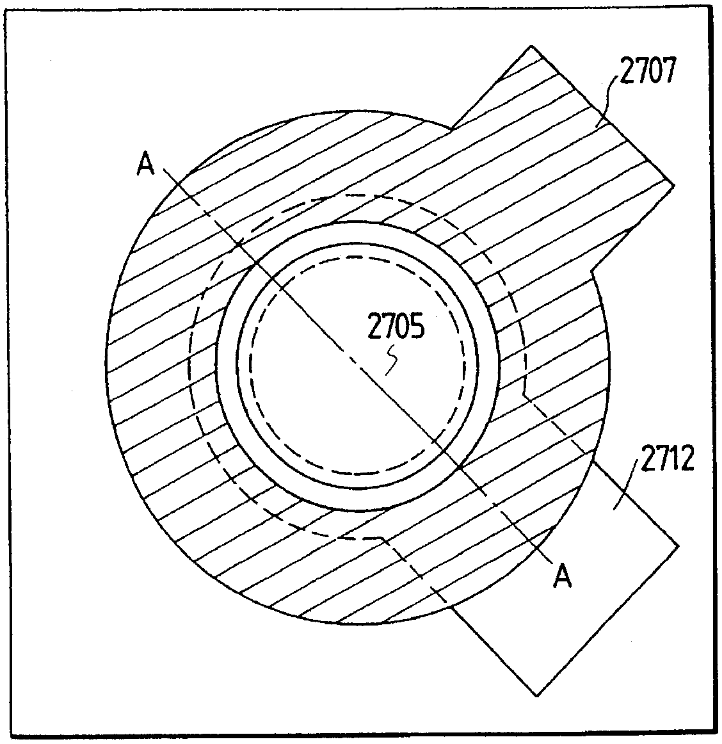
FIGS. 27A and 27B are respectively a schematic plan view and a schematic sectional view of an electron emission element according to Example 17 of the present invention.
Figure 27B:
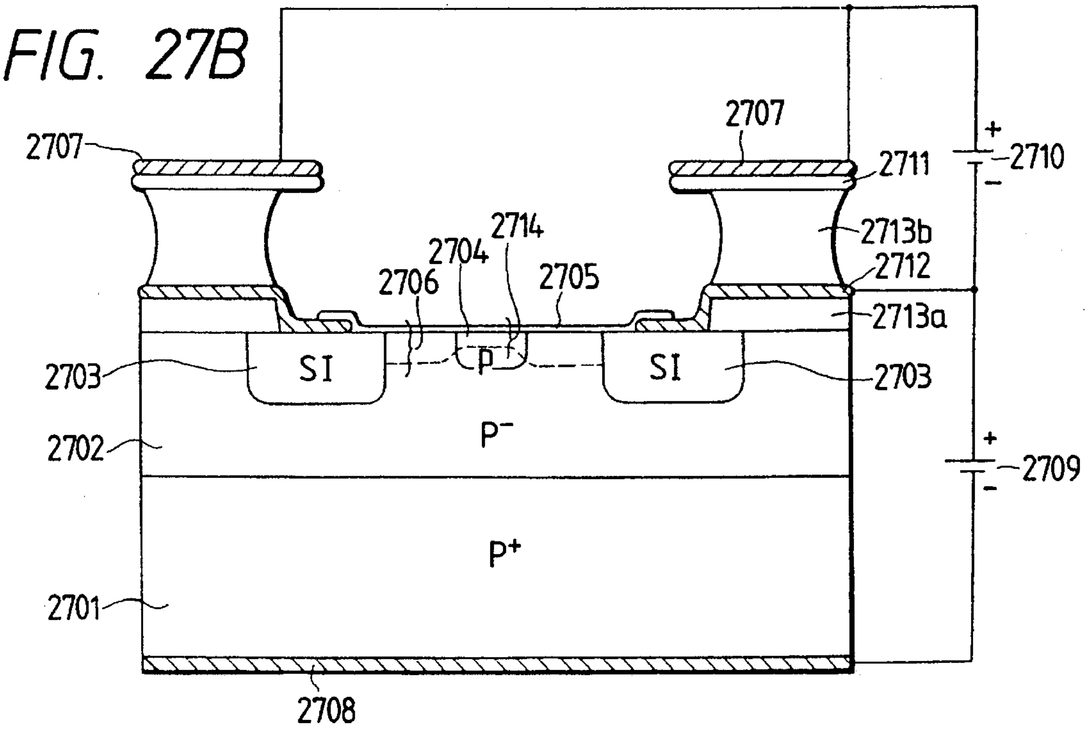
Figure 28:
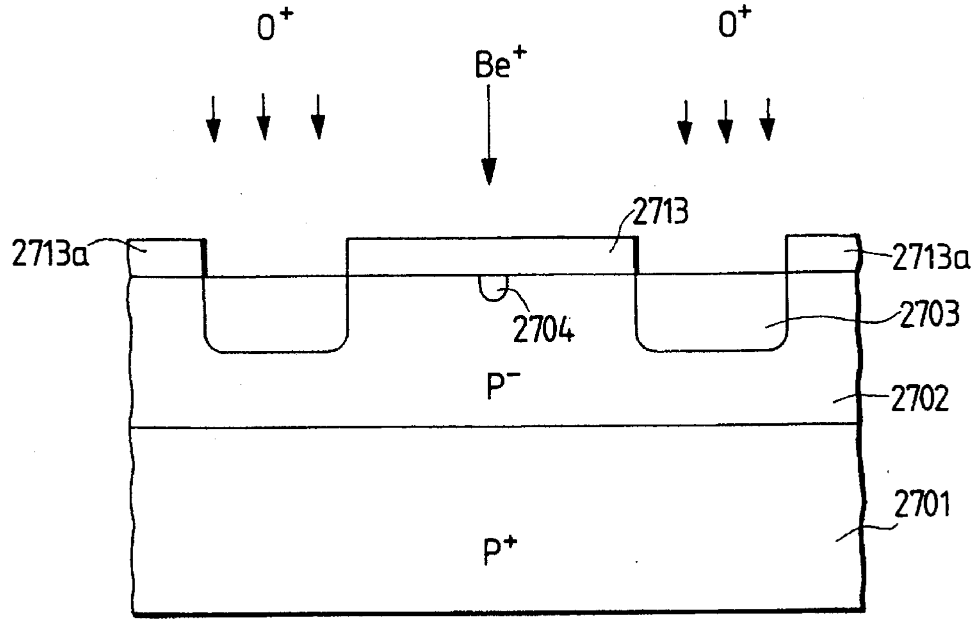
FIGS. 28, 29, and 30 schematic sectional views showing the steps in the manufacture of the element of the present invention when viewed from the same direction as the sectional view of FIG. 27 (B)
Figure 29:
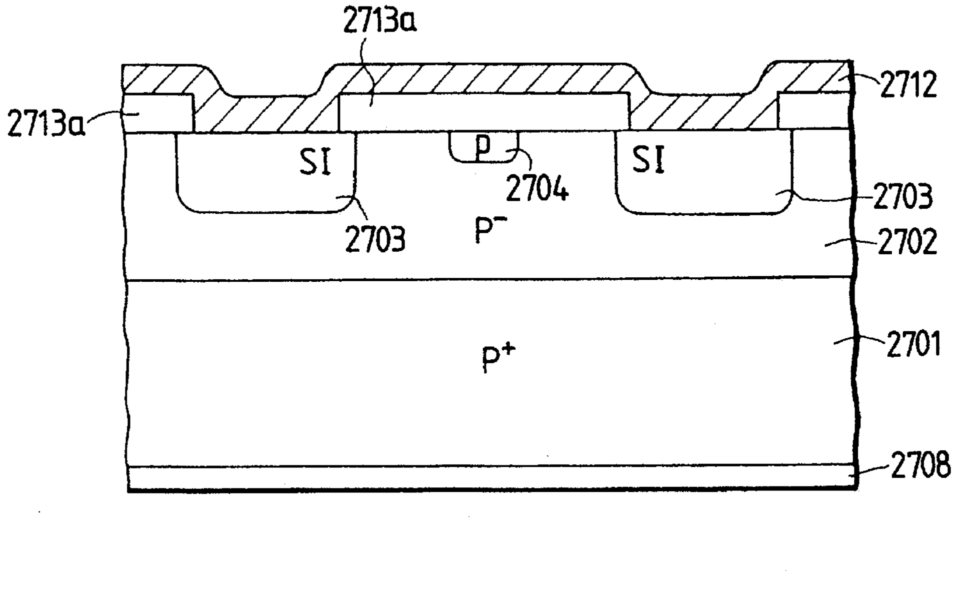
Figure 30:
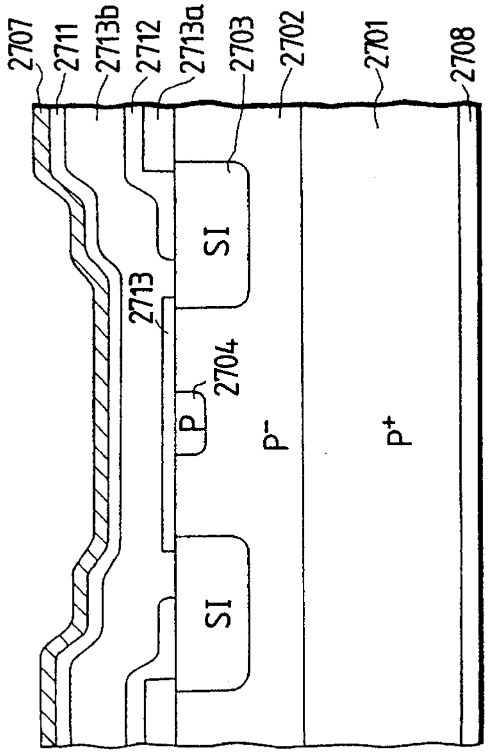

FIGS. 27A and 27B are schematic views showing Example 17 of a semiconductor electron emission element according to the present invention. FIG. 27A is a schematic plan view, and FIG. 27B is a schematic sectional view taken along an A—A section in FIG. 27A. FIGS. 28 to 30 schematically show the steps in the manufacture of the electron emission element shown in FIGS. 27A and 27B.

In this example, a Be-doped p-type epitaxial layer (p-type semiconductor layer) 2703 having a carrier concentration of $5\times10^{16}$ atoms/$cm^3$ was formed by MBE (molecular beam epitaxy) on a Zn-doped p-type GaAs substrate 2701 having a carrier concentration of $8\times10^{18}$ atoms/$cm^3$, and the resultant substrate was used as a material.

As shown in FIG. 28, after a 2,000-Å thick aluminum nitride film 2713*a* was deposited by CVD, the aluminum nitride film 2713*a* was removed by proper patterning to form a semi-insulating region, and O ions were then implanted at an acceleration voltage of 160 keV using a resist and the aluminum nitride film as a mask by an ion-implantation device. After the resist was removed, Be ions were implanted at an acceleration voltage of 80 keV via the aluminum nitride film 2713*a* by a maskless ion-implantation device. With this ion-implantation process, a semi-insulating region 2703 was formed to a depth of 4,000 Å, and at the same time, a high-concentration p-type region 2704 was formed to have a depth of 2,000 Å and a diameter of 2μ.

As described above, since maskless ion implantation is employed, multi-stage ion implantation and ion implantation of different kinds of ions can be performed, and a beam can be focused to about 1 μm. Therefore, not only the high-concentration p-type region but also the overall element structure could be manufactured on the order of submicrons, and a very small spot-like electron source could be formed.

As shown in FIG. 29, the ion-implantation portion was appropriately annealed while leaving the aluminum nitride film 2713. Thereafter, an Al film was deposited, as a contact electrode 2712, on the aluminum nitride film 2713. According to this method, the contact electrode 2712 can be self-aligned with the semi-insulating region.

As shown in FIG. 30, only the Al film near the high-concentration p-type region was removed by a phosphoric acid using a proper mask. A 1-μm thick silicon oxide film 2713*b* and a 2,000-Å thick silicon nitride film 2711 were deposited, and 1,000-Å thick palladium and gold films were then deposited as a lead electrode 2707. An opening was formed on the top portion of the electron source by patterning using a resist. The gold and palladium films of the contact electrode 2707 were milled by argon, and the silicon nitride film 2711 was then patterned by $CF_4$ plasma etching. Thereafter, the silicon oxide film 2713*b* was then removed by wet etching using hydrogen fluoride and ammonium fluoride. At this time, by utilizing the fact that the silicon nitride film and the silicon oxide film had considerably different etching rates during wet etching, a good tapered shape could be obtained in the lower portion of the lead electrode.

After the silicon nitride film 2713*a* near the high-concentration p-type region 2704 was removed by $CF_4$ plasma etching again, a $BaB_6$ film was deposited by EB deposition. The $BaB_6$ film was deposited to be connected to the contact electrode 2712 using an opening formed in the above-mentioned steps, thus forming a good Schottky junction. Finally, an unnecessary $BaB_6$ portion was removed together with a resist, thus completing a Schottky electron source shown in FIG. 27B.

The structure of the electron emission element manufactured by the above-mentioned method will be described in more detail with reference to FIGS. 27A and 27B.

In the electron emission element of this example, the p-type region 2704 is in contact with the Schottky electrode 2705 on the semiconductor substrate to form a Schottky junction, and a reverse bias voltage is applied across the Schottky electrode to cause an avalanche breakdown, thereby producing electron-hole pairs. Electrons produced by the electron-hole pairs are emitted from the semiconductor surface. In this example, the silicon nitride film 2711 was formed on the silicon oxide film 2713*b*, and the lead electrode 2707 was formed of palladium and gold.

In this example, a low breakdown voltage is generated in a Schottky junction portion 2714 in an opening by a remaining portion of the Schottky junction. In this example, since a thin depletion layer 2706 of the Schottky junction 2714 is formed in the junction portion 2714, a low breakdown voltage is generated. A local decrease in breakdown voltage can be obtained by forming the high-concentration doped p-type region 2704 in the junction portion 2714. The semi-insulating region 2703 is formed around the Schottky electrode to prevent leakage from the edge portion of the Schottky junction, thereby avoiding unnecessary current leakage.

This example has the contact electrode 2712, and the contact electrode 2712 is connected to the semi-insulating region 2703. Since the contact electrode 2712 is formed in advance and the Schottky electrode 2705 is formed to be connected to the contact electrode 2712 in the last process, a change in Schottky characteristics and a chemical change in Schottky electrode during a manufacturing process can be prevented as compared to a case wherein a Schottky junction is formed in advance.

In this example, the Schottky electrode 2705 comprises a $BaB_6$ film having a work function of 3.4 eV. It was experimentally found that a Schottky barrier height between $BaB_6$ and p-type GaAs was $\phi_{Bp}$=0.66 V, and an effective Schottky junction could be formed. $BaB_6$ exhibited sufficient conductivity, and was formed as a 100-Å thick film by EB deposition while its stoichiometric composition ratio was left unchanged.

The p-type substrate 2701 preferably comprises a high-concentration substrate so that the ohmic-contact layer 2708 can be easily formed on its lower surface. In the example shown in FIGS. 27A and 27B, the n-type region 2703 had an impurity concentration of $1\times10^{18}$ atoms/cm$^3$, the p-type region 2704 had an impurity concentration of $7\times10^{17}$ atoms/cm$^3$, the p-type semiconductor layer 2702 had an impurity concentration of $5\times10^{16}$ atoms/cm$^3$ and the p-type substrate 2701 had an impurity concentration of $8\times10^{18}$ atoms/cm$^3$. With these concentrations, the depletion layer in the Schottky junction 2714 can have a thickness of 800 Å in a breakdown state, and a breakdown voltage of 5 V and a maximum electric field of $1\times10^6$ V/cm can be obtained. In general, electrons can gain a higher energy from an avalanche breakdown as an electric field is higher. Since the high-concentration p-type region is set to have a concentration which is sufficient to obtain a maximum electric field, i.e., a doping amount not to cause a tunnel breakdown to control a breakdown, a higher energy can be applied to electrons.

Example 18

Figure 31:
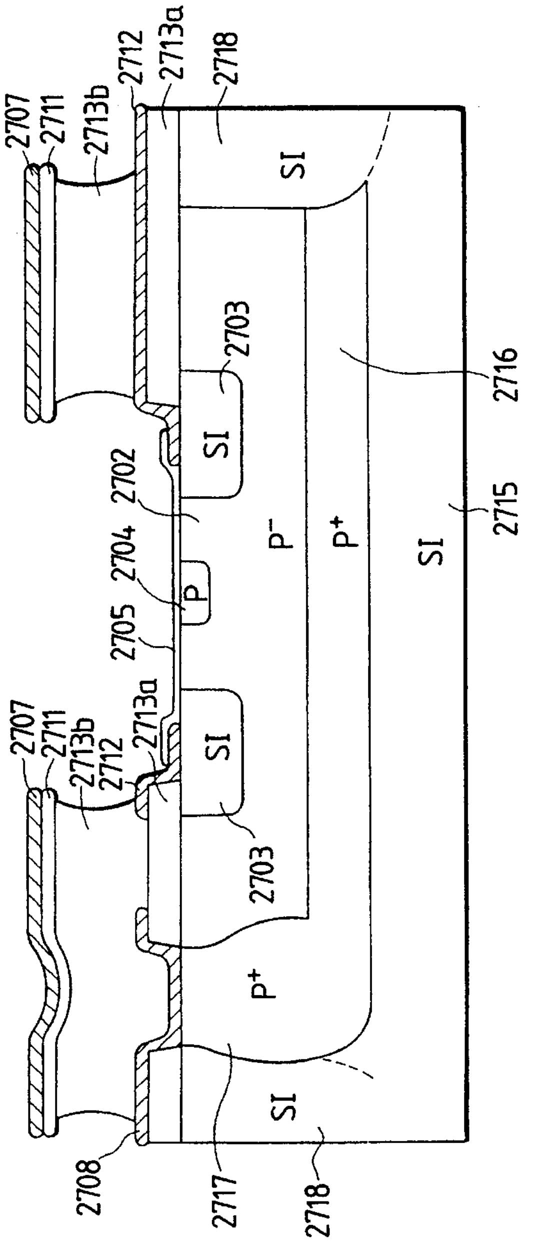
FIG. 31 is a schematic sectional view for explaining Example 18 of a semiconductor electron emission element according to the present invention.

FIG. 31 shows still another example of the present invention.

In this example, a large number of electron emission elements are formed on a single substrate, and element isolation is attained so that electron sources can be independently controlled.

In this example, a semi-insulating GaAs substrate was used. A p-type semiconductor layer was formed on the substrate, and electron emission elements shown in FIG. 27B were formed thereon. Furthermore, semi-insulating regions were formed around the elements by ion implantation to isolate the elements.

The method of manufacturing the electron emission elements of this embodiment will be described below.

A 1-μm thick Be-doped p-type semiconductor layer 2716 having a carrier concentration of $8\times10^{18}$ atoms/cm$^3$ was epitaxially grown by MBE on a semi-insulating GaAs substrate 2715 having insulating characteristics of $10^8$ Ω·.cm or higher, and a 1-μm thick Be-doped p-type semiconductor layer 2702 having a carrier concentration of $5\times10^{16}$ atoms/cm$^3$ was then epitaxially grown.

After a 2,000-Å thick aluminum nitride film 2713 was deposited by CVD, a semi-insulating region 2703 and a p-type region 2717 were formed following the same procedures as in Example 17. The resultant structure was properly patterned to form the p-type region 2717, thereby removing the aluminum nitride film. Be ions were then implanted at an acceleration voltage of 160 keV and a peak concentration of $1\times10^{19}$ atoms/cm$^3$ to be in contact with the p-type region 2716. The resultant structure was annealed to activate the implanted ions. Thereafter, H ions were implanted deep using a resist as a mask in order to form a semi-insulating layer 2718 to convert the semiconductor substrate into an amorphous substrate, thus realizing a semi-insulating substrate.

As ions used to semi-insulate the substrate, H ions were used in this example. Alternatively, B ions may be used. After the above-mentioned ion-implantation process, the same steps as in Example 17 were repeated.

[Effect of the Invention]

As described above, according to the present invention, in a Schottky semiconductor electron emission element, a MOLD structure is formed, and an impurity concentration difference of 10 times or more is preferably set, so that a breakdown in a high-concentration doping region can occur at a lower voltage than a breakdown caused by a high-electric field around a Schottky electrode. In this case, since a guard ring of a p-n junction which is required in a conventional structure can be omitted, the manufacturing process can be simplified, and a switching speed and a modulation frequency can be increased. Since the guard ring is omitted, an area necessary for forming the guard ring can be omitted, and the element can be rendered more compact.

Furthermore, according to the present invention, since a high-concentration p-type semiconductor region is formed, a uniform avalanche breakdown can be caused in a doped portion, and an electron beam having good uniformity and a very small spot size can be obtained.

According to the present invention, since the manufacturing process can be simplified, the manufacturing cost of the element can be decreased, and a manufacturing yield can be increased.

Since respective layers can be self-aligned with the high-impurity concentration region, one element can be formed to be very small, and the electron emission element can be applied to an IC.

Furthermore, since the LOCOS method is employed around a Schottky junction portion in a Schottky semiconductor electron emission element, a p-n junction guard ring can be omitted, and a switching recovery time can be shortened to almost zero to realize a very high modulation speed. Thus, an application range of the electron emission element can be widened. Furthermore, since element isolation and edge protection can be attained at the same time, the element can be micropatterned, and the manufacturing process can be further simplified.

In this case, since a p-type conductive layer including a local high-concentration portion is formed, a uniform avalanche breakdown can be caused in a doped portion, and an electron beam having good uniformity and a very small spot size can be obtained.

In addition, according to the present invention, since a wiring electrode and an electron emission electrode are formed on a voltage application electrode to share functions of the electrodes, an electron emission element which can obtain stable electron emission characteristics, can improve electron emission efficiency, and can increase a manufacturing yield of elements can be provided.

In particular, in a multi-type electron emission element in which a plurality of electron emission elements are arrayed, its structure is complicated. According to the present invention, however, the yield of elements can be greatly increased.

According to a semiconductor electron emission element according to the present invention, a p-type semiconductor layer is in contact with a Schottky electrode to form a Schottky diode, and the junction portion of the diode is reverse-biased, so that a vacuum level $E_{VAC}$ can be set at an energy level lower than a conduction band $E_C$ of the p-type semiconductor layer. Therefore, a larger energy difference $\Delta E$ than in a conventional structure can be easily obtained. When an avalanche breakdown is caused, a large number of electrons as minority carriers in a p-type semiconductor are produced to increase an emission current, and a high electric field is applied to a thin depletion layer to produce hot electrons, thus allowing easy extraction of electrons into vacuum.

Since a material having a larger work function $\phi_{WK}$ than that of cesium can be used as a Schottky electrode material, a selection range of surface materials can be greatly widened as compared to the prior arts, and high emission efficiency can be attained using a stable material.

In the manufacture of a Schottky electron source according to the present invention, a Schottky junction is formed to be parallel or substantially parallel to a semiconductor surface, so that the width of an energy distribution of emitted electrons can be decreased. Furthermore, since a lead electrode is formed, the work function of a surface is decreased, and electron emission efficiency by removing spatial charges can be increased. Since a Schottky electrode is formed of a material which has a small work function and is stable in air, efficiency can be improved, and handling in air can be facilitated. When a guard ring of an n-type or semi-insulating region is formed on a Schottky junction, leakage occurring near an electrode can be prevented to improve efficiency. In addition, a small high-concentration p-type region is formed to concentrate a current, and the element is rendered compact, thus preventing the element from being thermally destroyed.

In the manufacture of the semiconductor electron emission element, since the conventional semiconductor formation techniques and thin film formation techniques can be utilized, an element of the present invention can be manufactured at low cost and with high precision by the established techniques.

When an electron beam applied equipment (electronic equipment) such as a display is manufactured using an electron emission element of the present invention, an applied inexpensive electron beam equipment (electronic equipment) with high performance and reliability can be provided.

For example, the semiconductor electron emission element of the present invention can be suitably applied to a display, an EB drawing device, and a vacuum tube, and is also applicable to an electron beam printer, memory, and the like.

What is claimed is:

1. An electron emission device comprising a plurality of electron emission elements, each element of said plurality of electron emission elements comprising: a p-type semiconductor layer; a Schottky electrode for forming a Schottky junction with said p-type semiconductor layer; means for applying a reverse bias voltage to said Schottky electrode and said p-type semiconductor layer to cause said Schottky electrode to emit electrons; and a lead electrode for externally guiding the emitted electrons;

wherein a tapered oxide film is formed around the Schottky junction portion and a stripe of P+ type region arranged in a first direction (X-axis direction), and a stripe of the Schottky electrode arranged in a second direction (Y-axis direction) perpendicular to said first direction are provided two-dimensionally so that the intersections between the stripes constitute electron emission elements arranged in a matrix.

2. A element according to claim 1, wherein said p-type semiconductor substrate is formed of Si.

3. A device element according to claim 1, wherein said p-type semiconductor layer has a p-type doping region having a sufficiently high concentration to cause an avalanche breakdown, said doping region being connected to said Schottky electrode.

4. A device element according to claim 3, wherein an impurity concentration of said p-type high-concentration region falls within a range of $2\times10^{17}$ $cm^{-3}$ to $10\times10^{17}$ $cm^{-3}$, and an impurity concentration of a region other than said p-type high-concentration doping region in said p-type semiconductor layer falls within a range of $2\times10^{16}$ to $10\times10^{16}$ $cm^{-3}$.

5. A device element according to claim 1, wherein a thickness of said Schottky electrode is not more than 0.1 μm.

6. A device element according to claim 1, wherein said Schottky electrode is formed by converting Gd into a silicide by a heat treatment, and depositing an element selected from the group consisting of Ba and Cs for a layer having a thickness of one atom.

7. A device element according to claim 3, wherein the impurity concentration falls within a range of $2\times10^{16}$ to $10\times10^{16}$ $cm^{-3}$.

8. A device element according to claim 3, wherein an impurity concentration of said high-concentration doping region falls within a range of $2\times10^{17}$ $cm^{-3}$ to $10\times10^{17}$ $cm^{-3}$.

9. A device element according to claim 1, wherein said p-type semiconductor layer is formed on a p-type semiconductor substrate.

10. An electron emission (element) device which comprises a plurality of electron emission elements, each of the elements of said plurality of electron emission elements comprising: a semiconductor substrate having a p-type semiconductors layer whose impurity concentration falls within a concentration range for causing an avalanche breakdown in at least a portion of a surface thereof;

A Schottky electrode for forming a Schottky junction with said p-type semiconductor layer, means for applying a reverse bias voltage between said Schottky electrode and said p-type semiconductor layer to cause said Schottky electrode to emit electrons, and a lead electrode for externally guiding the emitted electrons, comprising;

a low-breakdown voltage portion formed in a portion of the Schottky junction portion having a concentration for locally lowering a breakdown voltage than other portions; and a semi-insulating region formed around said low-breakdown voltage portion, wherein said Schottky electrode has a small enough thickness to pass electrons produced in a depletion layer of the Schottky junction in the avalanche breakdown state and the thickness of said Schottky electrode is set to be not more than (0.14 m) 0.1 μm, and a stripe of P+ type region arranged in a first direction (X-axis direction), and a stripe of the Schottky electrode arranged in a second direction (Y-axis direction) perpendicular to said first direction are provided two-dimensionally so that intersections between the stripes constitute electron emission elements arranged in a matrix.

11. A device element according to claim 10, wherein the Schottky junction between said p-type semiconductor layer and said Schottky electrode is formed to be substantially parallel to a surface of said semiconductor substrate.

12. A device element according to claim 10, wherein an electrical insulating layer comprising at least one opening portion is formed on a surface of said semiconductor substrate to be parallel to the Schottky junction portion, and at least one lead electrode is formed on said electrical insulating layer at an edge portion of said opening portion.

13. A device element according to claim 10, wherein the low-breakdown voltage portion comprises a high-concentration p-type region formed by performing local high-concentration doping in said p-type semiconductor layer in insufficiently high concentration to cause an avalanche breakdown.

14. A device element according to claim 13, wherein said high-concentration doping p-type region is in contact with the Schottky junction.

15. A device element according to claim 13, wherein said high-concentration doping p-type region has a width of not more than 5μ.

16. A device element according to claim 12, wherein said opening portion is formed by an insulating layer of at least one layer, and a ratio of a diameter of said opening portion to a thickness of said insulating layer is not more than 2:1.

17. A device element according to claim 10, wherein said lead element comprises an electrode of at least one layer.

18. A device element according to claim 12, wherein said opening portion has a circular shape, and said lead electrode has an annular shape.

19. A device element according to claim 12, wherein said Schottky electrode comprises at least one layer of a material having a conductivity and a lower work function than an electron emission electrode.

20. A device element according to claim 12, wherein the material having the low work function is a borate selected from the group consisting of $LaB_6$, $BaB_6$, $CaB_6$, $SrB_6$, $YB_6$, $CeB_6$, and $YB_4$.

21. A device element according to claim 10, wherein said lead electrode is formed of gold.

22. A device element according to claim 12, wherein said insulating layer under said lead electrode is formed by two layers of silicon oxide and silicon nitride.

23. A device element according to claim 10, wherein said semiconductor substrate comprises a GaAs substrate.

24. An element according to claim 10, wherein said lead electrode is formed of palladium.

25. An electron emission device comprising a plurality of electron emission elements, each element of said plurality of electron emission elements comprising: a p-type semiconductor layer; a Schottky electrode for forming a Schottky junction with said p-type semiconductor layer; means for applying a reverse bias voltage to said Schottky electrode and said p-type semiconductor layer to cause said Schottky electrode to emit electrons; and a lead electrode for externally guiding the emitted electrons, a stripe of P+ type region arranged in a first direction (X-axis direction), and a stripe of the Schottky electrode arranged in a second direction (Y-axis direction) perpendicular to said first direction are provided two-dimensionally so that intersections between the stripes constitute electron emission elements arranged in a matrix.

26. An electron emission device according to claim 25, wherein said p-type semiconductor layer is formed of Si.

27. An electron emission device according to claim 25 wherein said p-type semiconductor layer has a p-type high-concentration doping region, said high-concentration doping region being connected to said Schottky electrode.

28. An electron emission device according to claim 27, wherein an impurity concentration of said p-type high-concentration region falls within a range of $2\times10^{17}$ cm⁻to $10\times10^{17}$ $cm^{-3}$, and an impurity concentration of a region other than said p-type high-concentration doping region in said p-type semiconductor layer falls within a range of $2\times10^{16}$ to $10\times10^{16}$ $cm^{-3}$.

29. An electron emission device according to claim 28, wherein a thickness of said Schottky electrode is not more than 0.1 μm.

30. An electron emission device according to claim 25, wherein said Schottky electrode is formed by converting Gd into a silicide by a heat treatment, and depositing one of Ba and Cs for a layer having a thickness of one atom.

31. An electron emission device according to claim 27, wherein an impurity concentration of said high-concentration doping region falls within a range of $2\times10^{17}$ $cm^{-3}$ to $10\times10^{17}$ $cm^{-3}$.

32. An electron emission device according to claim 28, wherein said p-type semiconductor layer is formed on a p-type semiconductor substrate.

* * * * *

UNITED STATES PATENT AND TRADEMARK OFFICE

CERTIFICATE OF CORRECTION

PATENT NO. : 5,554,859

DATED : September 10, 1996

INVENTORS : TAKEO TSUKAMOTO ET AL.

It is certified that error appears in the above-identified patent and that said Letters Patent is hereby corrected as shown below:

ON THE TITLE PAGE

[56] References Cited - Other Publications

Under Anantha et al.: "pp. 462-465" should read pp. 442-445--.

[57] Abstract, line 2:

"emission with" should read --emission element with--; Line 14" Group Group 3A" should read --Group 3A--.

COLUMN 1

Line 60, "applicants is e.g.," should read --applicants is shown, e.g.--.

COLUMN 3

Line 13, "repeated by a plurality" should read --repeated a plurality--.

COLUMN 4

Line 65, "than" should read --in the--.

UNITED STATES PATENT AND TRADEMARK OFFICE

CERTIFICATE OF CORRECTION

PATENT NO. : 5,554,859

DATED : September 10, 1996

INVENTORS : TAKEO TSUKAMOTO ET AL.

It is certified that error appears in the above-identified patent and that said Letters Patent is hereby corrected as shown below:

COLUMN 5

Line 37, "than" should read --in the--.

COLUMN 7

Line 20, "schematic" should read --are schematic--.

COLUMN 12

Line 23, "p274" should read --(p274--;
Line 24, "Edition." should read --Edition).--;
Line 26, "like" should read --as--;
Line 30, "$-\Phi B_N$" should read --$-\Phi_{BN}$--.

COLUMN 13

Talbe 2 first column "$GdB_4$)" should read --$GdB_4$--.

COLUMN 15

Line 41, "allowed" should read --sufficient--.

UNITED STATES PATENT AND TRADEMARK OFFICE

CERTIFICATE OF CORRECTION

PATENT NO. : 5,554,859

DATED : September 10, 1996

INVENTORS : TAKEO TSUKAMOTO ET AL.

It is certified that error appears in the above-identified patent and that said Letters Patent is hereby corrected as shown below:

COLUMN 18

Line 44, "allowed" should read --assured--.

COLUMN 20

Line 9, "$cm^3$" should read --$cm^{-3}$--;
Line 17, "a" should read --when a--;
Line 34, "the substantially" should read --substantially--.

COLUMN 24

Line 1, "$\Phi_{BP\ was}$" should read --$\Phi_{BP}$ was--;
Line 41, "(100)plane" should read --(100) plane--.

COLUMN 25

Line 11, "a" should read --when a--;
Line 52, delete "and";
Line 59, "$p^+$type" should read --$p^+$-type--.

COLUMN 26

Line 29, "has" should read --have--;

UNITED STATES PATENT AND TRADEMARK OFFICE

CERTIFICATE OF CORRECTION

PATENT NO. : 5,554,859

DATED : September 10, 1996

INVENTORS : TAKEO TSUKAMOTO ET AL.

It is certified that error appears in the above-identified patent and that said Letters Patent is hereby corrected as shown below:

COLUMN 26 continued

Line 43, "cheer" should read --chamber--.

COLUMN 27

Line 8, "like" should read --as--.

COLUMN 28

Line 18, "Cs----O" should read --Cs-O--;
Line 45, "p++" should read --$p^{++}$--;
Line 56, "$H_2$atmosphere" should read --$H_2$ atmosphere--.

COLUMN 30

Line 60, Delete "of the".

COLUMN 31

Line 6, "in" should read --in the --;
Line 24, "$cm^3$ the" should read --$cm^3$, the--;
Line 51, "then," should read --then--.

UNITED STATES PATENT AND TRADEMARK OFFICE
CERTIFICATE OF CORRECTION

PATENT NO. : 5,554,859

DATED : September 10, 1996

INVENTORS : TAKEO TSUKAMOTO ET AL.

It is certified that error appears in the above-identified patent and that said Letters Patent is hereby corrected as shown below:

COLUMN 33

Line 29, "Schottky" should read --the Schottky--.

COLUMN 34

Line 15, "Ω:cm" should read --Ω.cm--.

COLUMN 36

Line 19, "portion and" should read --portion, and--;
Line 27, "An element" should read --A device--;
Line 29, Delete "element";
Line 34, Delete "element";
Line 40, Delete "element";
Line 42, Delete "element";
Line 47, Delete "element";
Line 50, Delete "element";
Line 53, Delete "element";
Line 55, Delete "(element)";
Line 59, "conductors" should read --conductor--.

UNITED STATES PATENT AND TRADEMARK OFFICE

CERTIFICATE OF CORRECTION

PATENT NO. : 5,554,859

DATED : September 10, 1996

INVENTORS : TAKEO TSUKAMOTO ET AL. Page 6 of 7

It is certified that error appears in the above-identified patent and that said Letters Patent is hereby corrected as shown below:

COLUMN 37

Line 5, "than" should read --than in--;
Line 13, Delete (0.14 M)";
Line 22, and 26, Delete "element".
Line 33, Delete "element";
Line 37, "insufficiently" should read --sufficiently--;

Line 42, Delete "element";
Line 45, Delete "element";
Line 49, Delete "element";
Line 51, Delete "element";
Line 54, Delete "element".

COLUMN 38

Line 1, Delete "element" and "12" should read --19--;
Line 5, Delete "element";
Line 7, Delete "element";
Line 10, Delete "element";
Line 37, "cm$^{-}$to" should read --cm$^{-3}$ to--:
Line 42, "28" should read--25--.

UNITED STATES PATENT AND TRADEMARK OFFICE

CERTIFICATE OF CORRECTION

PATENT NO. : 5,554,859

DATED : September 10, 1996

INVENTORS : TAKEO TSUKAMOTO ET AL

It is certified that error appears in the above-identified patent and that said Letters Patent is hereby corrected as shown below:

COLUMN 38 continued

Line 53, "28" should read --25--.

Signed and Sealed this

Twenty-fourth Day of June, 1997

Attest:

BRUCE LEHMAN

*Attesting Officer*

*Commissioner of Patents and Trademarks*